(12) United States Patent
Lee et al.

(10) Patent No.: US 7,978,539 B2
(45) Date of Patent: Jul. 12, 2011

(54) SEMICONDUCTOR DEVICE HAVING RESISTANCE BASED MEMORY ARRAY, METHOD OF READING, AND SYSTEMS ASSOCIATED THEREWITH

(75) Inventors: Kwang Jin Lee, Hwaseong-si (KR); Byung Gil Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 433 days.

(21) Appl. No.: 12/292,891

(22) Filed: Nov. 28, 2008

(65) Prior Publication Data

US 2009/0237978 A1 Sep. 24, 2009

(30) Foreign Application Priority Data

Mar. 21, 2008 (KR) ........................ 10-2008-0026390

(51) Int. Cl.
*G11C 7/22* (2006.01)
(52) U.S. Cl. .............. 365/189.15; 365/148; 365/189.07; 365/189.05
(58) Field of Classification Search ............. 365/189.15, 365/148, 189.07, 189.05
See application file for complete search history.

(56) References Cited

U.S. PATENT DOCUMENTS

| | | | |
|---|---|---|---|
| 6,351,406 B1 | 2/2002 | Johnson et al. | |
| 6,462,998 B1 * | 10/2002 | Proebsting | 365/205 |
| 6,545,906 B1 | 4/2003 | Savtchenko et al. | |
| 6,849,891 B1 | 2/2005 | Hsu et al. | |
| 7,038,961 B2 | 5/2006 | Sakata et al. | |
| 7,282,759 B2 | 10/2007 | Kim et al. | |
| 7,542,357 B2 * | 6/2009 | Sakata et al. | 365/189.17 |
| 2007/0195582 A1 * | 8/2007 | Sakata et al. | 365/148 |
| 2009/0257292 A1 * | 10/2009 | Lee et al. | 365/189.15 |
| 2010/0103723 A1 * | 4/2010 | Kawai et al. | 365/163 |
| 2010/0131708 A1 * | 5/2010 | Park et al. | 711/115 |

OTHER PUBLICATIONS

K. Pagiamtzis et al., "Content-Addressable Memory (CAM) Circuits and Architectures: A Tutorial and Survey 'Content-addressable memory", Wikipedia artical, Apr. 26, 2008.

* cited by examiner

*Primary Examiner* — Tuan T. Nguyen
(74) *Attorney, Agent, or Firm* — Harness, Dickey & Pierce

(57) ABSTRACT

In one embodiment, the semiconductor device includes a non-volatile memory cell array. Memory cells of the non-volatile memory cell array are resistance based, and each memory cell has a resistance that changes over time after data is written into the memory cell. A write address buffer is configured to store write addresses associated with data being written into the non-volatile memory cell array, and a read unit is configured to perform a read operation to read data from the non-volatile memory cell array. The read unit is configured to control a read current applied to the non-volatile memory cell array during the read operation based on whether a read address matches one of the stored write addresses and at least one indication of settling time of the data being written into the non-volatile memory cell array.

40 Claims, 27 Drawing Sheets

| 10_1 | 10_2 | 10_3 | 10_4 | 10_5 | 10_6 | 10_7 | 10_8 |
|------|------|------|------|------|------|------|------|
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |

FIG. 23

| S3 | S2 | S1 | SEL_VBIAS13 | SEL_VBIAS12 | SEL_VBIAS11 | SEL_VBIAS14 |
|---|---|---|---|---|---|---|
| 0 | 0 | 0 | 0 | 0 | 0 | 1 |
| 0 | 0 | 1 | 0 | 0 | 1 | 0 |
| 0 | 1 | 0 | 0 | 1 | 0 | 0 |
| 0 | 0 | 1 | 0 | 0 | 1 | 0 |
| 1 | 0 | 0 | 1 | 0 | 0 | 0 |
| 0 | 0 | 1 | 0 | 0 | 1 | 0 |
| 0 | 1 | 0 | 0 | 1 | 0 | 0 |
| 0 | 0 | 1 | 0 | 0 | 1 | 0 |

SEMICONDUCTOR DEVICE HAVING RESISTANCE BASED MEMORY ARRAY, METHOD OF READING, AND SYSTEMS ASSOCIATED THEREWITH

PRIORITY INFORMATION

The subject application claims priority under 35 U.S.C. 119 on Korean application no. 10-2008-0026390 filed Mar. 21, 2008; the contents of which are hereby incorporated by reference in their entirety.

CROSS REFERENCE TO RELATED APPLICATIONS

The subject application is related to co-pending application Ser. Nos. 12/292,890, 12/292,897 and 12/292,896; all of which are hereby incorporated by reference in their entirety.

BACKGROUND

Embodiments relate to semiconductor devices having a resistance based memory array. For example, a resistance based memory array may be a PRAM (phase change material RAM), RRAM (resistive RAM), MRAM (magnetic RAM), etc.

SUMMARY OF THE INVENTION

The present invention relates to a semiconductor device.

In one embodiment, the semiconductor device includes a non-volatile memory cell array. Memory cells of the non-volatile memory cell array are resistance based, and each memory cell has a resistance that changes over time after data is written into the memory cell. A write address buffer is configured to store write addresses associated with data being written into the non-volatile memory cell array, and a read unit is configured to perform a read operation to read data from the non-volatile memory cell array. The read unit is configured to control a read current applied to the non-volatile memory cell array during the read operation based on whether a read address matches one of the stored write addresses and at least one indication of settling time of the data being written into the non-volatile memory cell array.

Another embodiment includes a non-volatile memory cell array. Memory cells of the non-volatile memory cell array are resistance based, and each memory cell has a resistance that changes over time after data is written into the memory cell. A write address buffer is configured to store write addresses associated with data being written into the non-volatile memory cell array, and a read unit is configured to perform a read operation to read data from the non-volatile memory cell array. The read unit is configured to control a read current applied to the non-volatile memory cell array during the read operation based on whether a read address matches one of the stored write addresses and at least one indication of an amount of time since data was written into the non-volatile memory cell array.

The present invention also relates to implementations of the semiconductor device.

For example, one example implementation is a card. In one embodiment, the card includes a memory and a control unit configured to control the memory. The memory includes a non-volatile memory cell array. Memory cells of the non-volatile memory cell array are resistance based, and each memory cell has a resistance that changes over time after data is written into the memory cell. The memory further includes a write address buffer is configured to store write addresses associated with data being written into the non-volatile memory cell array, and a read unit configured to perform a read operation to read data from the non-volatile memory cell array. The read unit is configured to control a read current applied to the non-volatile memory cell array during the read operation based on whether a read address matches one of the stored write addresses and at least one indication of settling time of the data being written into the non-volatile memory cell array.

Another example implementation is a system. In one embodiment, the system includes a bus, a semiconductor device connected to the bus, an input/output device connected to the bus, and a processor connected to the bus. The processor is configured to communicate with the input/output device and the semiconductor device via the bus. The semiconductor device includes a non-volatile memory cell array. Memory cells of the non-volatile memory cell array are resistance based, and each memory cell has a resistance that changes over time after data is written into the memory cell. The semiconductor device further includes a write address buffer is configured to store write addresses associated with data being written into the non-volatile memory cell array, and a read unit configured to perform a read operation to read data from the non-volatile memory cell array. The read unit is configured to control a read current applied to the non-volatile memory cell array during the read operation based on whether a read address matches one of the stored write addresses and at least one indication of settling time of the data being written into the non-volatile memory cell array.

The present invention further relates to a method of reading data from a semiconductor device.

In one embodiment, the method includes storing data being written into the non-volatile memory cell array in a write buffer, storing write addresses associated with data being written into the non-volatile memory cell array, and controlling a read current applied to the non-volatile memory cell array during a read operation based on whether a read address matches one of the stored write addresses and at least one indication of settling time of the data being written into the non-volatile memory cell array.

BRIEF DESCRIPTION OF THE DRAWINGS

The present invention will become more fully understood from the detailed description given herein below and the accompanying drawings, wherein like elements are represented by like reference numerals, which are given by way of illustration only and thus are not limiting of the present invention and wherein:

FIG. 23 illustrates the logic state of the first-fourth bias selection signals SEL_VBIAS11-SEL_VBIAS14 in FIG. 22 with respect to the composite intermediate signals S1, S2 and S3 of FIG. 22

DETAILED DESCRIPTION OF EMBODIMENTS

Figure 1:
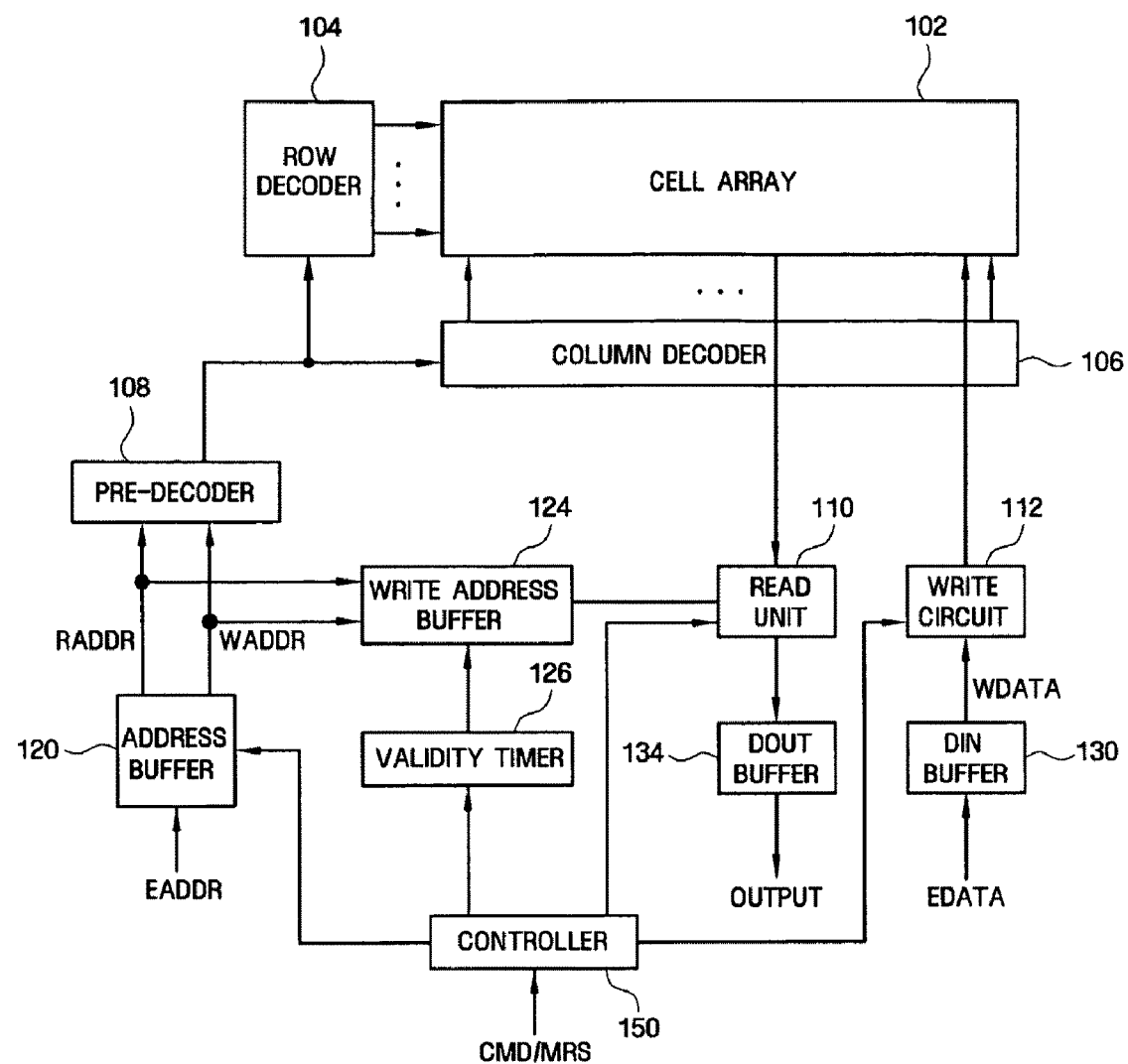
FIG. 1 illustrates a semiconductor device according to an embodiment.

Example embodiments will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structures, and well-known technologies are not described in detail to avoid the unclear interpretation of the example embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

There are numerous types of non-volatile memories. A newer type of non-volatile memory is a resistive material based memory array. For example, a resistance based memory array may be a PRAM (phase change material RAM), RRAM (resistive RAM), MRAM (magnetic RAM), etc. MRAMs use spin torque transfer phenomenon (STT). Spin torque transfer writing technology is a technology in which data is written by aligning the spin direction of the electrons flowing through a TMR (tunneling magneto-resistance) element. Data writing is performed by using a spin-polarized current with the electrons having the same spin direction. U.S. Pat. No. 6,545,906 discloses an example MRAM, and is incorporated herein by reference in its entirety.

RRAM or ReRAM takes advantage of controllable resistance changes in thin films of various resistance materials. For example, a dielectric, which is normally insulating, can be made to conduct through a filament or conduction path formed after application of a sufficiently high voltage. The conduction path formation can arise from different mechanisms, including defects, metal migration, etc. Once the filament is formed, the filament may be reset (broken, resulting in high resistance) or set (re-formed, resulting in lower resistance) by an appropriately applied voltage. During application of the appropriate voltage, resistance varies until the high resistance or low resistance state is achieved. U.S. Pat. Nos. 6,849,891 and 7,282,759 disclose example RRAMs, and are both incorporated herein by reference in their entirety.

PRAMs rely on the application of heat to phase change resistor cells to change the resistive state of the phase change resistor cells. Normally, a current is supplied to the phase change resistor cell to apply the heat. The amount and duration of the current establishes whether the phase change resistor cell achieves a low resistance state or achieves a high resistance state. The low resistive state is called a set state and may represent, for example, a logic zero state. The high resistive state is called a reset state, and may represent, for example, a logic high state. GST or a chalcogenide alloy is a common phase change material used in the phase change resistor cells.

After application of heat to effect a state change, an amount of time must pass before the phase change material stabilizes in the set or reset states. Accordingly reading from a cell prior to the cell settling in the set or reset state may result in incorrect reading of data from the memory cell array.

First Embodiment

Figures 2, 3:
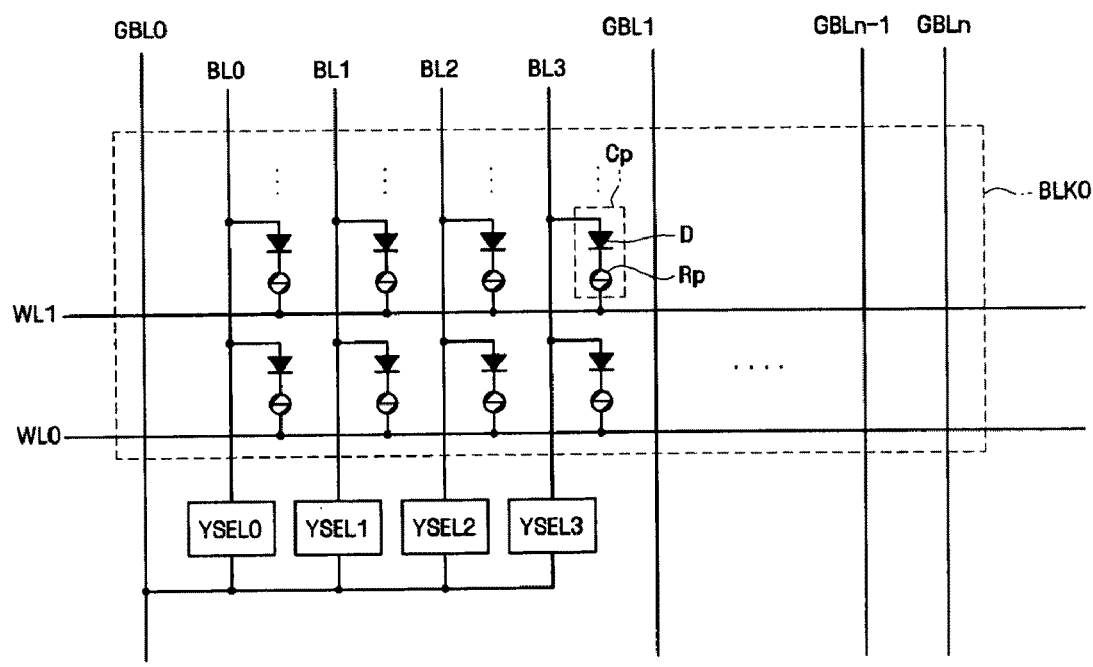
FIG. 2 illustrates a layout of the cell array in FIG. 1 according to one embodiment.
FIG. 3 illustrates a portion of memory block BLK0 in FIG. 2.

FIG. 1 illustrates a semiconductor device according to an embodiment. As shown, the semiconductor device includes a non-volatile memory cell array 102. In one embodiment, the non-volatile memory cell array 102 is a resistive material based memory cell array. For the purposes of example only, the memory cell array 102 will be described as being a phase change memory cell array (PRAM); however, it will be understood that the memory cell array 102 may another applicable resistive material based memory array such as RRAM, MRAM, etc. FIG. 2 illustrates a layout of the cell array 102 according to one embodiment. As shown, the memory cells in the array are divided into memory banks 10, and each memory bank 10 is divided into memory blocks BLKi. FIG. 3 illustrates a portion of memory block BLK0. It will be appreciated that the other memory blocks may be structured in the same manner. As shown, PRAM cells Cp are located at the intersections of word lines Wi (e.g., W1 and W2) and bit lines BLi (e.g., BL0, BL1, BL2, and BL3). Each PRAM cell Cp includes a current control device D and a phase change resistor cell Rp connected in series between a respective bit line BLi and a word line Wi. As shown, each current control device D is a diode, but may instead be a transistor. Furthermore, each phase change resistor cell Rp may be formed of phase change material disposed between two electrodes. The phase change material may be GeSbTe (GST), GaSb, InSb, InSe, $Sb_2Te_3$, GeTe, GeSbTe, GaSeTe, InSbTe, $SnSb_2Te_4$, InSbGe, AgInSbTe, (GeSn)SbTe, GeSb(SeTe), $Te_{81}Ge_{15}Sb_2S_2$, etc. It will be appreciated that the memory cells Cp may serve as multi-level cells (MLC). Here instead of just the set and reset states, the memory cell Cp may be programmed to states between the set and reset state such that the memory cell Cp stores more than 1 bit of data. For example, if four states exist, each state may represent two bits of data.

Furthermore, the present invention is not limited to any particular cell array structure, or use of a particular cell array structure with a particular resistance material based memory. Instead, any cell structure such as 3D, crosspoint, wafer stack, etc. may be implemented in the embodiments of the present invention. U.S. Pat. No. 6,351,406 discloses such an example cell structure, and is incorporated by reference herein in its entirety.

A column selector YSELi selectively connects each respective bit line BLi to a global bit line GBL0. This structure is repeated for several global bit lines GBLi. Furthermore, while only two word lines are shown, it will be appreciated that a single block BLKi may include more than two word lines, with the commensurate increase in PRAM cells Cp. Similarly, instead of four bit lines BLi being associated with each global bit line GBLi, more or less than four bit lines BLi may be associated with each global bit line GBLi.

Returning to FIG. 1, an external address EADDR is received and buffered by an address buffer 120 in association with a command CMD received by a controller 150. The controller 150 decodes the command CMD into a write command, read command, etc. The controller 150 sends the read or write command to the address buffer 120. For write commands, the address buffer 120 stores and outputs the external address EADDR as a write address WADDR. For read commands, the address buffer 120 stores and outputs the external address EADDR as a read address RADDR.

A pre-decoder 108 pre-decodes the received read or write address into row and column addresses. A row decoder 104 further decodes the row address and selectively drives the word lines WLi in the memory cell array 102. A column decoder 106 further decodes the column address and selectively controls the column selectors YSELi to connect bit lines BLi to global bit lines GBLi.

During a write operation, the write addresses output from the address buffer 120 are stored by a write address buffer 124. In conjunction, externally supplied data EDATA is buffered by a data input buffer 134, and supplied as write WDATA to a write circuit 112. The write circuit 112, as instructed by the controller 150, writes the write data WDATA in the memory cell array 102 by supplying the appropriate currents and/or voltages to set or reset the memory cells consistent with the logic states of the write data WDATA. As discussed above, the memory cells being written are selected by the row and column decoders 104 and 106.

Figure 4:
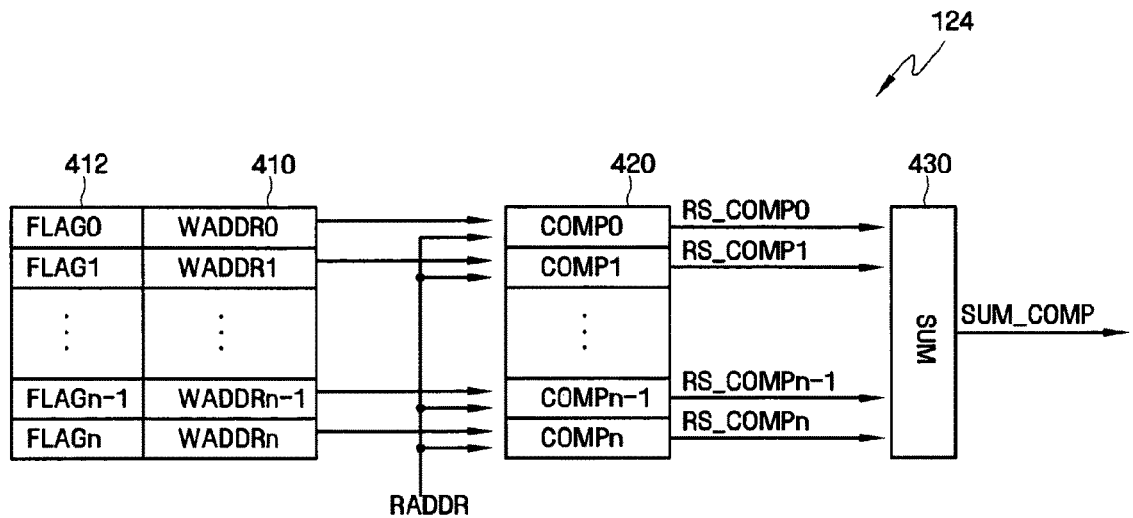
FIG. 4 illustrates an example of the write address buffer in FIG. 1.

FIG. 4 illustrates an example of the write address buffer 124. As shown, each write address is stored in an entry 410 of the write address buffer 124, and each entry 410 has an associated validity flag 412. When the write address buffer 124 stores a write address in an entry 410, the write address buffer 124 sets the validity flag 412 associated with the entry 410 to "1". This indicates the entry 410 is valid. Validity flags 412 are reset based on output from a validity timer 126 shown in FIG. 1.

The validity timer 126 measures a set period of time referred to as the validity time period. Measuring or counting down this time period restarts (or resets) with each receipt of a write command from the controller 150. Accordingly, consecutively received write commands cause successive resetting of the validity time period such that the validity time period expires after the set period of time from the last received write command. The validity timer 126 informs the write address buffer 124 of the validity time period or at least expiration of the validity time period via a validity timing signal VT. In response to expiration of the validity time period, the write address buffer 124 sets the validity flags 412 for each entry 410 to "0," which indicates the entries 410 are not valid. In one embodiment, the validity time period is set equal to or longer than a period of time for data written into the memory cell array 102 to settle or stabilize. For example, the validity time period may be set longer than the expected settling time by a desired margin to account for manufacturing variations. The validity time period may be programmable by applying a command or mode register set such that, in response, the controller 150 programs a received desired validity time in the validity timer 126. The validity time period may also be set in other ways such as through fuses, etc.

During a read operation, the read address RADDR supplied to the pre-decoder 108 by the address buffer 120 is also supplied to the write address buffer 124. As shown in FIG. 4, the write address buffer 124 includes a comparator 420 associated with each entry 410. Each comparator 420 compares the write address WADDR stored in the corresponding entry 410 with the received read address RADDR, and generates a comparison result RS_COMPi, for i=0 to n. In one embodiment, the comparison result RS_COMP is a logic "1" if the read and write addresses match, and is a logic "0" if the read and write addresses do not match. A summer 430 performs a logical OR operation on the output from the comparators 420 to generate a composite comparison result SUM_COMP. Namely, if the read address RADDR matches at least one write address WADDR, then the composite comparison result SUM_COMP will be a logic "1"; otherwise, the composite comparison result SUM_COMP will be a logic "0".

Figure 5:
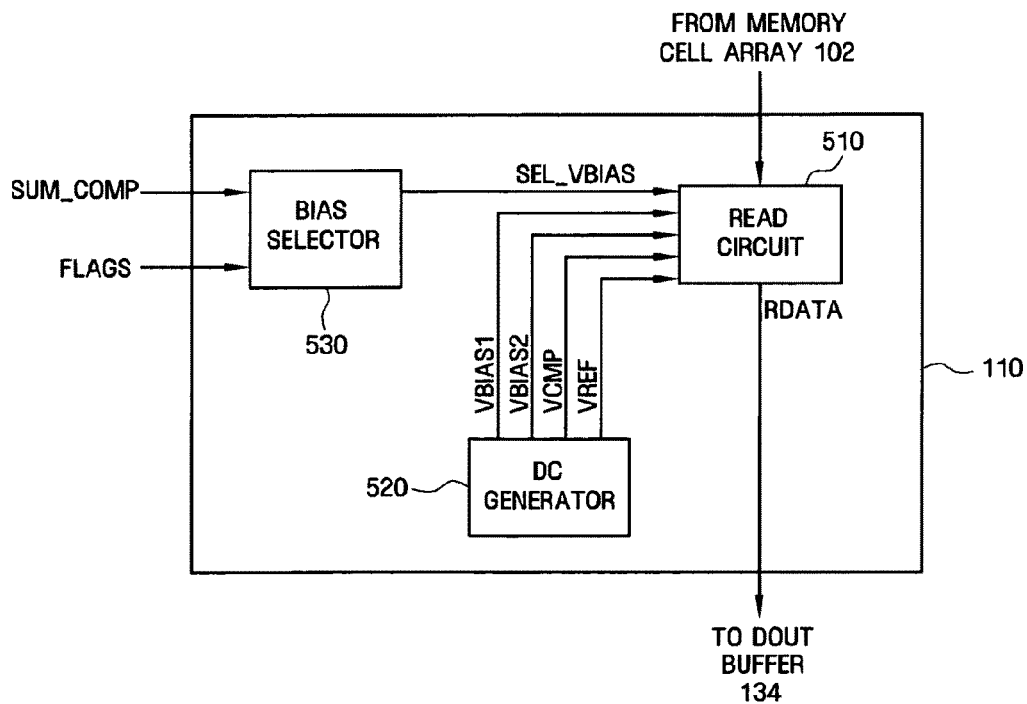
FIG. 5 illustrates one embodiment of the read unit in FIG. 1.

Also during the read operation, a read unit 110 shown in FIG. 1 reads the data from the addressed memory cell or cells, and outputs the read data to a data output driver 130. The data output driver 130 buffers the read data, and outputs the read data. FIG. 5 illustrates one embodiment of the read unit 110. As shown, the read unit 110 includes a read circuit 510 that reads the data from the address memory cell or cells. The read circuit 510 receives operational voltages from a dc generator 520, and a bias selection signal SEL_VBIAS from a bias selector 530.

Figure 6:
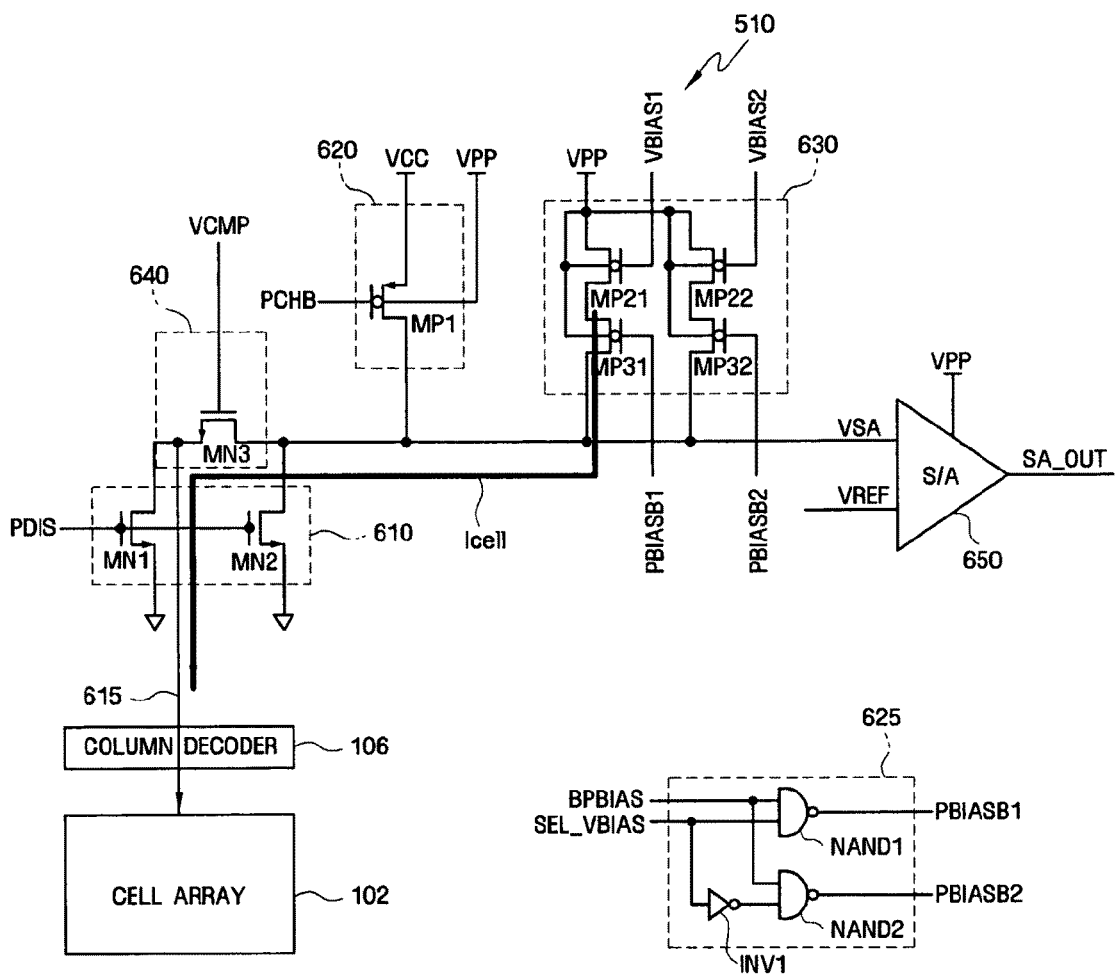
FIG. 6 illustrates a circuit diagram of the read circuit in FIG. 5 according to one embodiment.

FIG. 6 illustrates a circuit diagram of the read circuit 510 according to one embodiment. As shown, the read circuit 510 includes a discharge unit 610, a pre-charge unit 620, a bias selection unit 625, a read bias unit 630, a current clamping unit 640, and a sensing unit 650.

The discharging unit 610 discharges the bit line BLi, to which the read unit 510 is connected by the column decoder 106, in response to a control signal PDIS from the controller 150. For example, the discharge unit 610 includes NMOS transistors MN1 and MN2 connected between the bias application line 615 and ground. The transistors MN1 and MN2 receive the control signal PDIS at their gates. The current clamping unit 640 includes an NMOS transistor MN3 that selectively restricts current flow to the memory cell array 102 in response to a clamp control signal VCMP from the dc voltage generator 520.

The pre-charge unit 620 pre-charges the bias application line 615 (e.g., pre-charges the sensed voltage VSA) to a certain level (e.g., VCC in FIG. 6) in response to a pre-charge signal PCHB from the controller 150. As shown in FIG. 6, the pre-charge unit 620 includes a PMOS transistor MP1 connected between a pre-charge voltage VCC and the bias application line 615. The PMOS transistor MP1 receives the pre-charge signal PCHB at its gate.

The sensing unit 650 is a sense amplifier that compares a sensed voltage VSA to a reference voltage VREF from the dc voltage generator 520, and generates a comparison result SA_OUT indicative of data stored in a memory cell of the memory array 102. In particular, the read bias unit 630 applies a current via the bias application line 615, the column decoder 106 and a bit line BLi to a memory cell Cp. The resistance state of the memory cell Cp times the applied current affects the voltage VSA on the bias application line 615. The sense unit 650 senses whether this voltage VSA represents a set state of the memory cell Cp or a reset state of the memory cell Cp. For example, if the sensed voltage VSA is greater than the reference voltage VREF, then the comparison result SA_OUT is a logic high voltage. If the sensed voltage VSA is less than or equal to the reference voltage VREF, then the comparison result SA_OUT is a logic low voltage.

Figure 7:
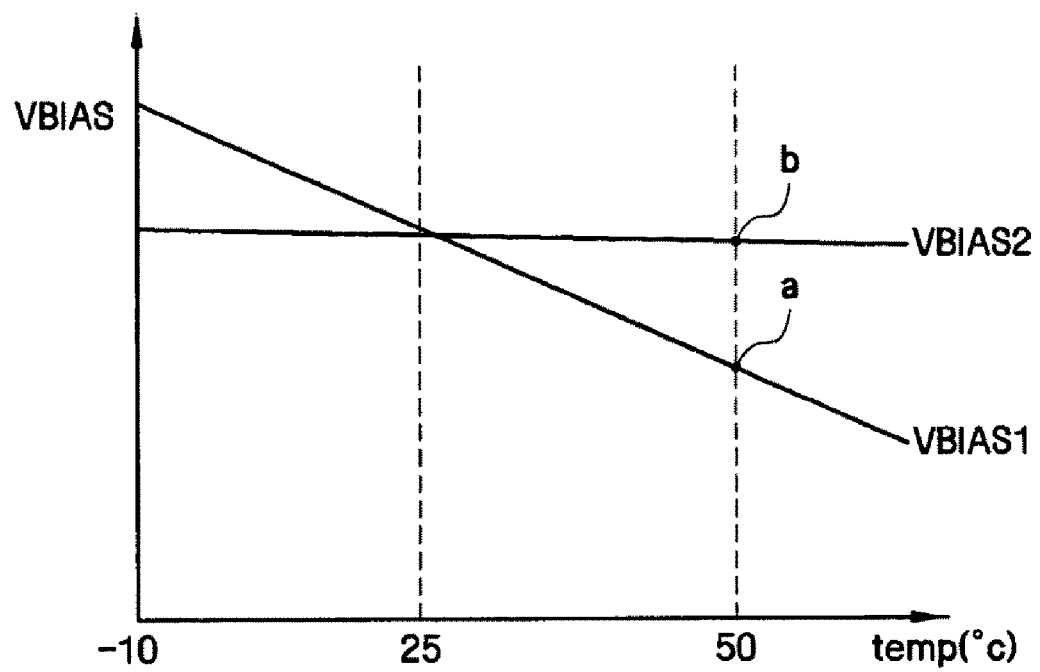
FIG. 7 illustrates examples of the first and second biases VBAIS in FIG. 6.

The read bias unit 630 includes first and second PMOS transistors MP21 and MP31 connected in series between a power source voltage VPP and the bias application line 615. The first PMOS transistor MP21 receives a first bias VBIAS1 at its gate, and the second PMOS transistor MP31 receives a first program bias PBIAS1 at its gate. The read bias unit 630 further includes third and fourth PMOS transistors MP22 and MP32 connected in series between the power source voltage VPP and the bias application line 615. The third PMOS transistor MP22 receives a second bias VBIAS2 at its gate, and the fourth PMOS transistor MP32 receives a second program bias PBIAS2 at its gate. The dc voltage generator 520 supplies the first and second biases VBIAS1 and VBIAS2. In one embodiment the second bias VBIAS2 is greater than the first fixed bias VBIAS 1. In another embodiment, the second bias VBIAS2 is fixed with respect to temperature, but the first bias VBIAS1 changes with temperature. For example, the first and second biases VBAIS may be as shown in FIG. 7. As shown, for temperatures greater than 25 degrees Celsius, the first bias VBIAS1 is equal to or less than the second bias VBIAS2. In this embodiment, the dc voltage generator 520 may be configured using temperature dependent elements to produce the first and second biases VBIAS1 and VBIAS2 as shown in FIG. 7. Alternatively, a temperature sensor may supply temperature information to the dc voltage generator 520, and the dc voltage generator 520 may generates the first and second biases VBIAS1 and VBIAS2 as shown in FIG. 7 based on the temperature information.

The bias selection unit 625 supplies the first and second program biases PBIAS1 and PBIAS2. In particular, the bias selection unit 625 includes a first NAND gate NAND1 that inputs a base program bias BPBIAS and a bias selection signal SEL_VBIAS, and outputs the first program bias PBIAS1. An inverter INV1 inverts the bias selection signal SEL_VBIAS. A second NAND gate NAND2 inputs the base program bias BPBIAS and the inverted selection signal, and outputs the second program bias PBIAS2. Accordingly, if the bias selection signal SEL_VBIAS is a logic high voltage, the first program bias PBIAS1 is a logic low voltage (e.g., a logic "0" voltage) and the second program bias voltage PBIAS2 is a logic high voltage (e.g., a logic "1" voltage). If the bias selection signal SEL_VBIAS is a logic low voltage, the first program bias PBIAS1 is a logic high voltage and the second program bias voltage PBIAS2 is a logic low voltage.

As a result, if the bias selection signal SEL_VBIAS is logic high, the read bias unit 630 supplies a first current ICell1 to the bias application line 615 consistent with the first bias VBIAS1. If the bias selection signal SEL_VBIAS is logic low, the read bias unit 630 supplies a second current ICell2 to the bias application line 615 consistent with the second bias VBIAS2. As discussed above, because the second bias VBIAS2 is greater than the first bias VBIAS1, the read bias unit 630 supplies a greater current to the bias application line 615 if the bias selection signal SEL_VBIAS is logic high than if the bias selection signal SEL_VBIAS is logic low (i.e., first current ICell1 is greater than second current ICell2). The supplied current times the resistance of the read memory cell Cp produces the sensed voltage VSA on the bias application line 615.

Figure 8A:
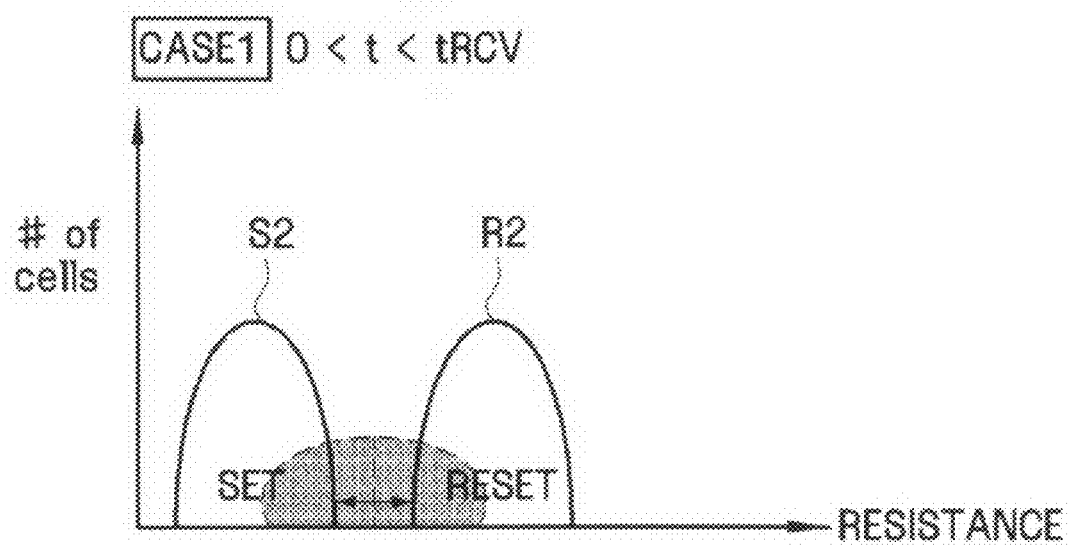
FIGS. 8A-8B illustrates the sensing margins between the set and reset states of a memory cell Cp over time.
Figure 8B:
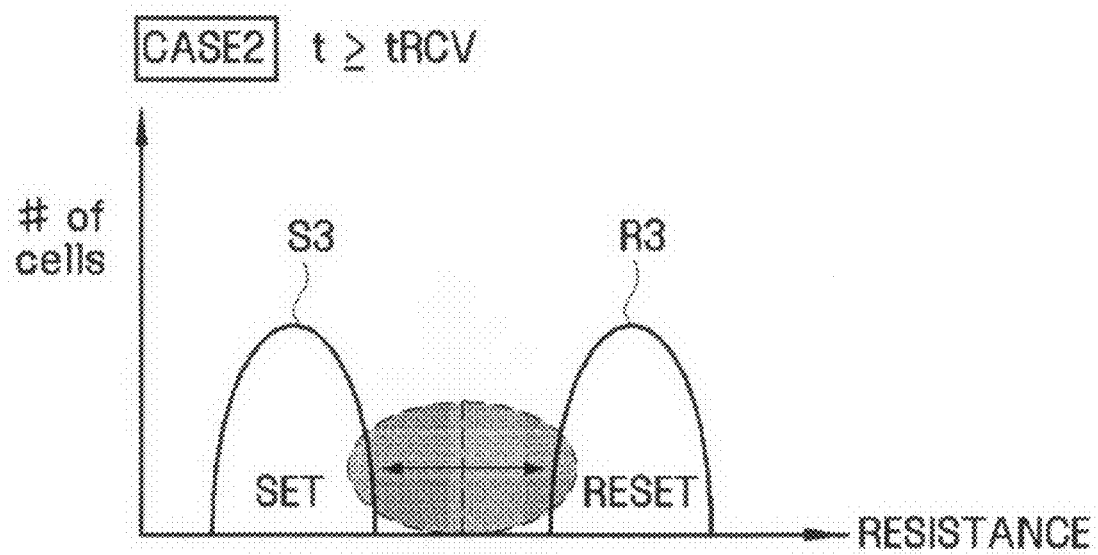

FIGS. 8A-8B illustrates the sensing margins between the set and reset states of a memory cell Cp over time. FIG. 8A illustrates the resistance distributions of the set and reset state after a write operation and before the written data has settled in the memory cell (i.e., before the set or reset state has stabilized). If the settling time is tRCV, then FIG. 8A illustrates the sensing margin between the set and reset states for time "t" since the write operation, where 0<t<tRCV. FIG. 8B illustrates the resistance distributions between the set and reset states after the written data has settled in the memory cell. Again, if the settling time is tRCV, then FIG. 8B illustrates the sensing margin between the set and reset states for time "t" since the write operation, where t>=tRCV.

As shown, by FIGS. 8A and 8B, the resistance distributions change over time. Therefore, if the read bias unit 630 supplied the same current before and after tRCV, then the sensed voltage VSA for the set state before and after tRCV would differ greatly and the sensed voltage VSA for the reset state before and after tRCV would differ greatly. These differences may result in read errors. Accordingly, the read bias unit 630 supplies different currents before and after tRCV to account for the changes in resistance distributions. As such, the difference in sensed voltage VSA for the set state before and after tRCV is significantly reduced and the difference in the sensed voltage VSA for the reset state before and after tRCV is significantly reduced. As such read errors are reduced.

Figure 9:
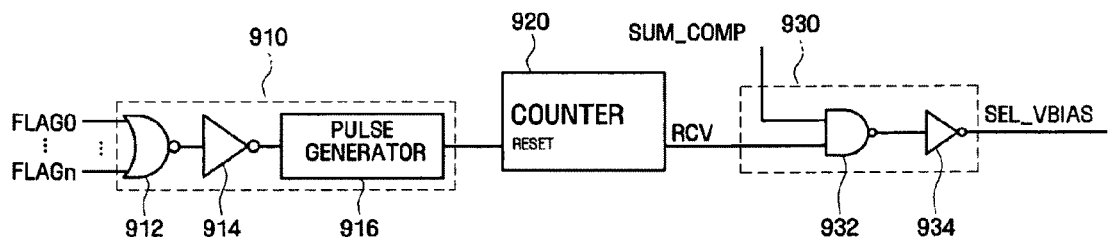
FIG. 9 illustrates an embodiment of the bias selector in FIG. 5.

FIG. 9 illustrates an embodiment of the bias selector 530. As shown, a reset unit 910 generates a reset signal based on the flags FLAG0 to FLAGn from the write address buffer 124 to selectively reset a counter 920. In particular, the reset unit 910 includes a NOR gate 912 that NORs the flags FLAG0 to FLAGn, an inverter 914 the inverts the output from the NOR gate 912, and a pulse generator 916 that generates a pulse based on the output from the inverter 914. The NOR gate 912 generates a logic "0" if any of the flags FLAG0 to FLAGn are set. Namely, only if none of the flags FLAG0 to FLAGn are set does the NOR gate 912 generate a logic "1". Therefore, the inverter 914 generates a logic "1" if any of the flags FLAG0 to FLAGn are set. The pulse generator 916 generates a pulse if a logic "1" is received such that the pulse generator 916 generates a pulse whenever a write address is stored in the write buffer 124.

A counter 920 measures the recovery time period tRCV. Measuring or counting down this time period restarts (or resets) based on the reset signal from the reset unit 910. Accordingly, consecutively received write addresses cause successive resetting of the recovery time period such that the recovery time period expires after the set period of time from the last received write address. The counter 920 informs a bias selection signal generator 930 of the recover time period or at least expiration of the recovery time period via a recovery timing signal RCV. In this embodiment, during the recovery time period, the recovery timing signal RCV is logic "1", and after the recovery time period the recovery timing signal RCV is logic "0."

A bias selection signal generator 930 generates the bias selection signal SEL_VBIAS based on the recovery timing signal RCV and the composite comparison result SUM_COMP from the write address buffer 124. In particular, the bias selection signal generator 930 includes NAND gate 932 that NANDs the recovery timing signal RCV and the composite comparison result SUM_COMP. It will be recalled that the composite comparison result SUM_COMP has a logic "1" state if a currently received read address RADDR matches a write address WADDR stored in the write address buffer 124. Accordingly, if both the recovery timing signal RCV and the composite comparison result SUM_COMP are logic "1" the NAND gate 932 outputs a logic "0"; otherwise, the NAND gate 932 outputs a logic "1". Stated another way, if the recovery timing period has not expired and a currently received read address RADDR matches a write address WADDR, then the NAND gate 932 outputs a logic "0". An inverter 934 inverts the output of the NAND gate 932 to generate the bias selection signal SEL_BIAS. Accordingly, the bias selection signal SEL_BIAS is logic "1" (a logic high voltage) if the recovery timing period has not expired and a currently received read address RADDR matches a stored write address WADDR.

Accordingly, the read bias unit 630 supplies a current to the bias application line 615 consistent with the first bias VBIAS1 if the recovery timing period has not expired and a currently received read address RADDR matches a write address WADDR. Otherwise, the read bias unit 630 supplies a current to the bias application line 615 consistent with the second fixed bias VBIAS2.

Figure 10:
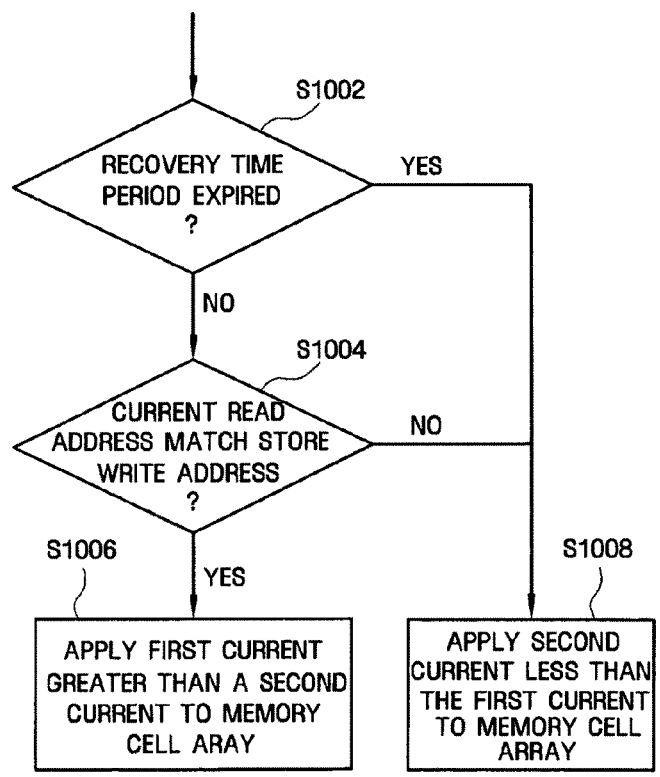
FIG. 10 illustrates a flow chart of a read concept according to one embodiment.

FIG. 10 illustrates a flow chart of the read concept according to one embodiment. As shown, during a read operation, in step S1002, the read unit 110 effectively determines if the recovery time period has expired from the last write operation. If not, then in step S1004 the read unit 110 effectively determines if the current read address matches a stored write address. If so, then in step S1006, the read unit 110 applies the first current ICell1 to the memory cell array 102 in reading data from the memory cell array 102. In step S1002, if the recovery time period has expired, then in step S1008, the read unit 110 applies the second current ICell2, which is less than the first current ICell1, to the memory cell array 102. Similarly, in step S1004 if the current read address does not match a stored write address, then in step S1008, the read unit 110 applies the second current ICell2 to the memory cell array 102. It will be appreciated that step S1004 may be performed before or concurrently with step S1002.

In this embodiment, the read unit 110 applies different read currents before and after expiration of the recovery time period recognizing that the resistance distributions of set and reset states for a cell differ before and after the recovery time period. However, the resistance distributions of the set and reset states change over time during the recovery time period. Accordingly, different currents may be applied at different time intervals of the recovery time period to still further reduce variations in the sensed voltage VSA for the set and reset states.

Second Embodiment

Figure 11:
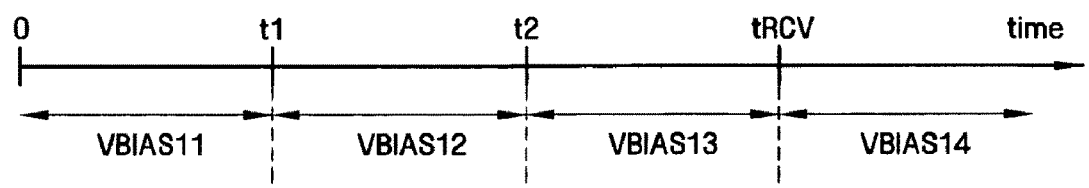
FIG. 11 illustrates a time line for an embodiment in which the recovery time period has been divided into three time intervals.

FIG. 11 illustrates a time line for an embodiment in which the recovery time period has been divided into three time intervals. As shown, the second bias VBIAS2 is still applied by the read unit after the recovery time period tRCV, but three different biases VBIAS11, VBIAS12 and VBIAS13 are applied during the recovery time period. Namely, the bias VBIAS11 is applied from 0<t<t1; bias VBIAS12 is applied from t1<t<t2; and VBIAS13 is applied from t2<t<tRCV. In this embodiment, the time periods are equal such that t1=tRCV/3 and t2=2tRCV/3. However, it will be appreciated that the present invention is not limited to dividing the recovery time period into three time intervals, or equal time intervals.

Figure 12:
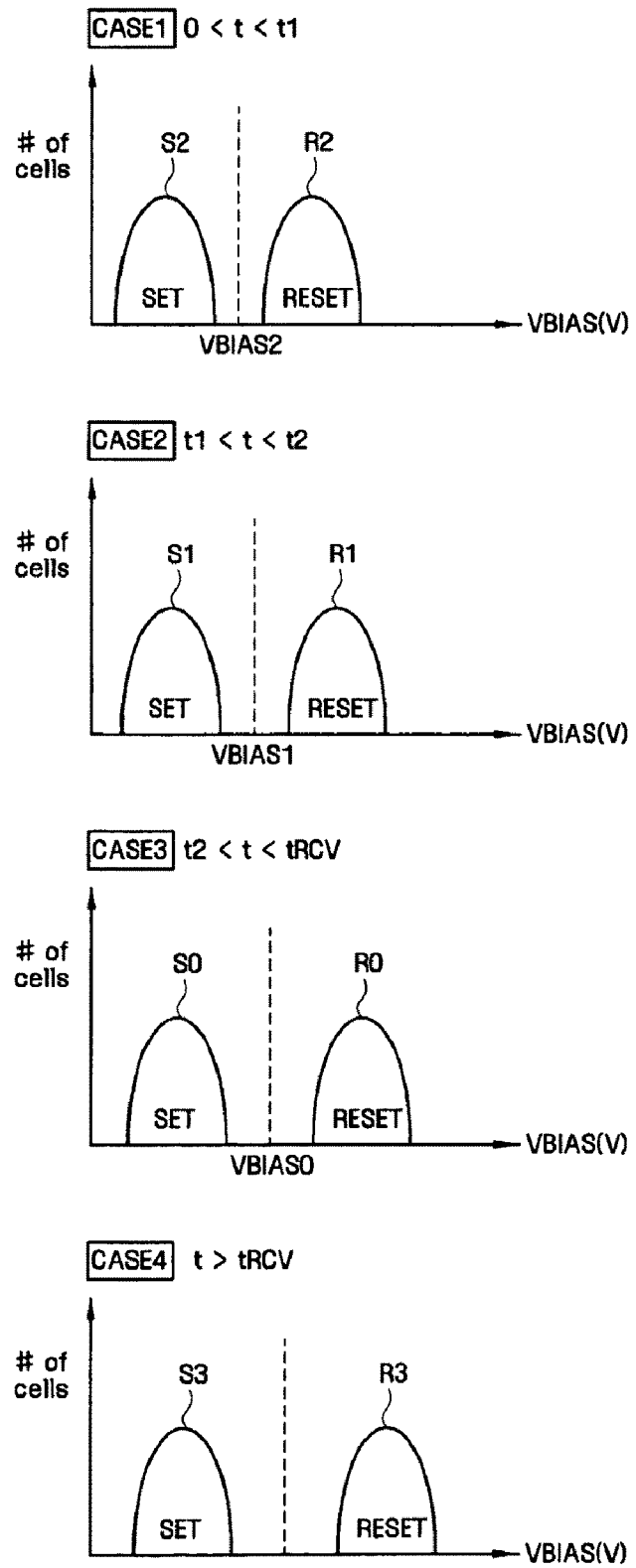
FIG. 12 illustrates the resistance distributions for the set and reset states during the time period of FIG. 11.

FIG. 12 illustrates the resistance distributions for the set and reset states during the time period of FIG. 11. As shown in FIG. 12, the resistance distributions change over time. Most notably, the reset resistance distribution increases over time.

Figure 13:
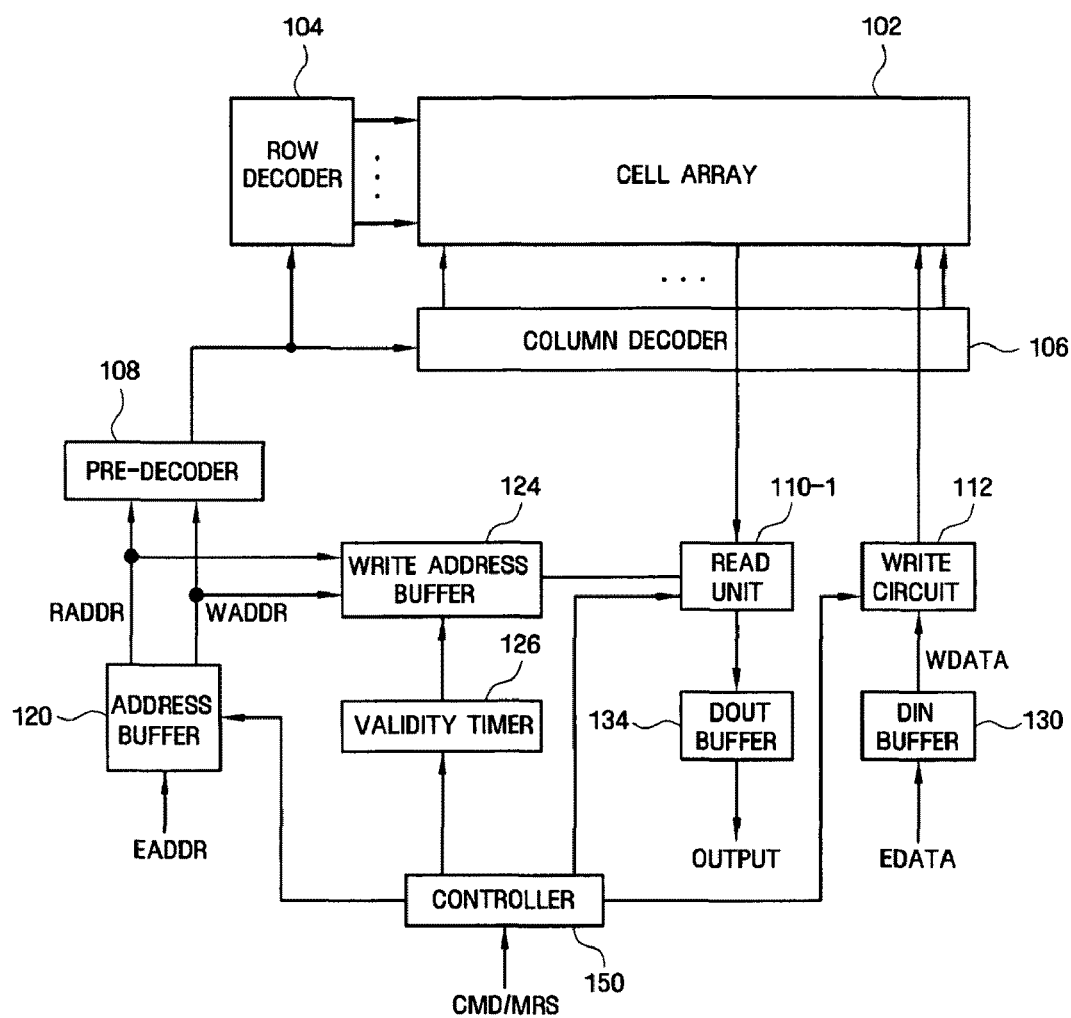
FIG. 13 illustrates a semiconductor device according to another embodiment.
Figure 14:
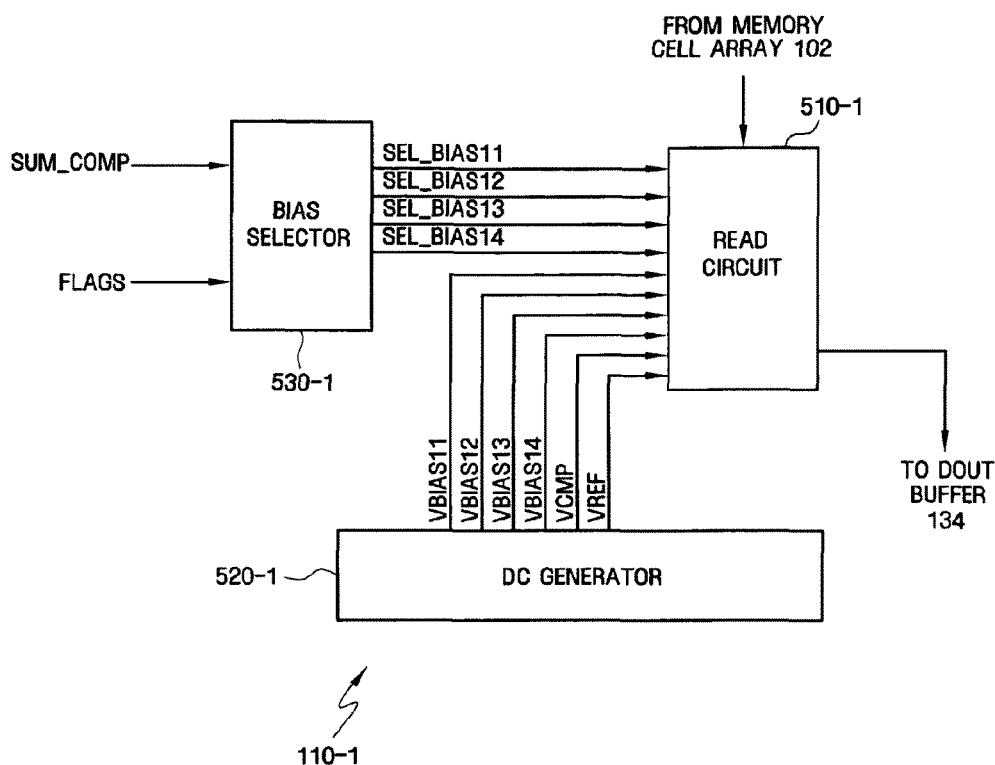
FIG. 14 illustrates one embodiment of the read unit in FIG. 13.

FIG. 13 illustrates a semiconductor device according to this embodiment. As shown, the embodiment of FIG. 13 is the same as the embodiment of FIG. 1 except that the read unit 110 has been replaced with the read unit 110-1. Accordingly, only the differences between the embodiment of FIG. 13 and the embodiment of FIG. 1 will be described for the sake of brevity. FIG. 14 illustrates an embodiment of the read unit in FIG. 13. As shown, the read unit 110-1 includes a read circuit 510-1 that reads the data from the addressed memory cell or cells. The read circuit 510-1 receives operational voltages from a dc generator 520-1, and receives selection signals SEL_VBIAS11, SEL_VBIAS12, SEL_VBIAS13 and SEL_VBIAS14 from a bias selector 530-1.

Figure 15:
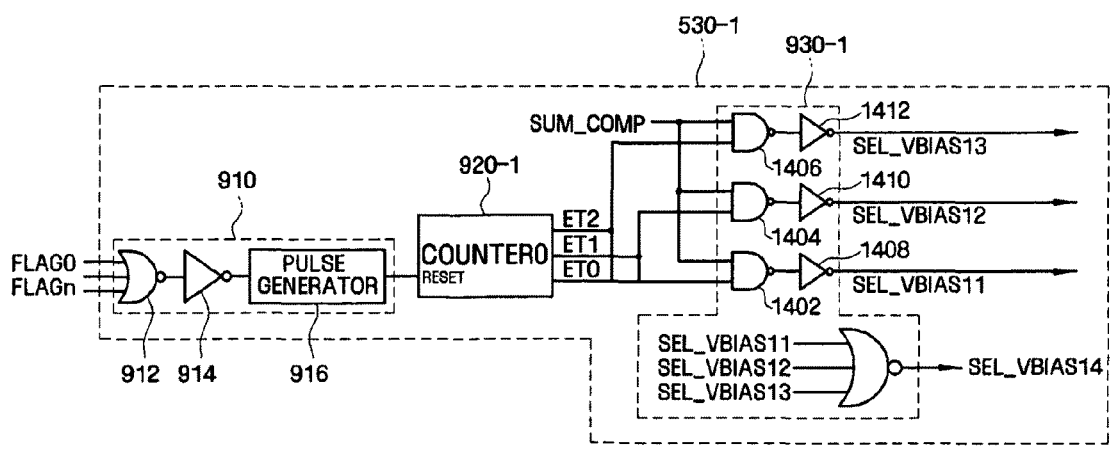
FIG. 15 illustrates one embodiment of the bias selector in FIG. 15.

FIG. 15 illustrates an embodiment of the bias selector 530-1. As shown, the bias selector 530-1 includes the same reset unit 910 as in the embodiment of FIG. 9. Accordingly, a description of the reset unit 910 will not be repeated. It will be recalled that the pulse generator 916 generates a pulse whenever a write address is stored in the write buffer 124.

A counter 920-1 measures three time periods that collectively comprise the recovery time period tRCV. With reference to FIG. 11, time 0 refers to receipt of a pulse from the reset unit 910. The counter measures a first time period from time t=0 to time t=t1; measures a second time period from time t=t1 to time t=t2; and measures a third time period from time t=t2 to t=tRCV. Measuring or counting down the first time period restarts (or resets) based on the reset signal from the reset unit 910, measure or counting down the second time period starts at the expiration of the first time period, and measuring or counting down the third time period starts at the expiration of the second time period. The counter 920-1 informs a bias selection signal generator 930-1 of the first, second and third time periods or at least expiration of the first, second and third time period via respective first, second and third timing signals ET0, ET1 and ET2. In this embodiment, during each of the first, second and third time periods, the respective first, second and third timing signal ET0, ET1 and ET2 is logic "1", and logic "0" otherwise.

A bias selection signal generator 930-1 generates first, second, third and fourth bias selection signals SEL_VBIAS11, SEL_VBIAS12, SEL_VBIAS13 and SEL_VBIAS14 based on the first, second and third timing signals ET0, ET1 and ET2 and the composite comparison result SUM_COMP from the write address buffer 124. In particular, the bias selection signal generator 930-1 includes first, second and third NAND gates 1402, 1404 and 1406. The first NAND gate 1402 receives the composite comparison result SUM_COMP and the first timing signal ET0, the second NAND gate 1404 receives the composite comparison result SUM_COMP and the second timing signal ET1, and the third NAND gate 1406 receives the composite comparison result SUM_COMP and the third timing signal ET2. First, second and third inverters 1408, 1410 and 1412 invert output from the first, second and third NAND gates 1402, 1404 and 1406, respectively. Outputs from the first, second and third inverters 1408, 1410 and 1412 are the first, second, and third bias selection signals SEL_VBIAS11, SEL_VBIAS12, SEL_VBIAS13, respectively.

Accordingly, if the composite comparison result SUM_COMP indicates a match between the currently received read address RADDR and stored write address WADDR (i.e., is logic "1"), then: (1) the first bias selection signal SEL_VBIAS11 is logic "1" if the first timing signal ET0 is logic "1", (2) the second bias selection signal SEL_VBIAS12 is logic "1" of the second timing signal ET1 is logic "1", and (3) the third bias selection signal SEL_BIAS13 is logic "1" if the third timing signal ET2 is logic "1." If the composite comparison result SUM_COMP is logic "0" (indicating no match), then the first, second, and third bias selection signals SEL_VBIAS11, SEL_VBIAS12, SEL_VBIAS13 will be logic "0". Similarly, if the respective timing signal is logic "0", then the respective bias selection signal is logic "0." Stated another way, the first bias selection signal SEL_VBIAS11 is logic "1" during the first time period if a match exists, the second bias selection signal SEL_VBIAS12 is logic "1" during the second time period if a match exists, and the third bias selection signal SEL_VBIAS13 is logic "1" during the third time period if a match exists.

The bias selection signal generator 930-1 also includes a NOR gate 1414 that NORs the first-third bias selection signals SEL_VBIAS11-SEL_VBIAS13 to produce the fourth bias selection signal SEL_VBIAS14. As such, the fourth bias selection signal SEL_VBIAS14 is logic "1" if the first-third bias selection signals SEL_VBIAS11-SEL_VBIAS13 are all logic "0". Namely, the fourth bias selection signal SEL_VBIAS14 is logic "1" if the recovery time period tRCV has expired.

Figure 16:
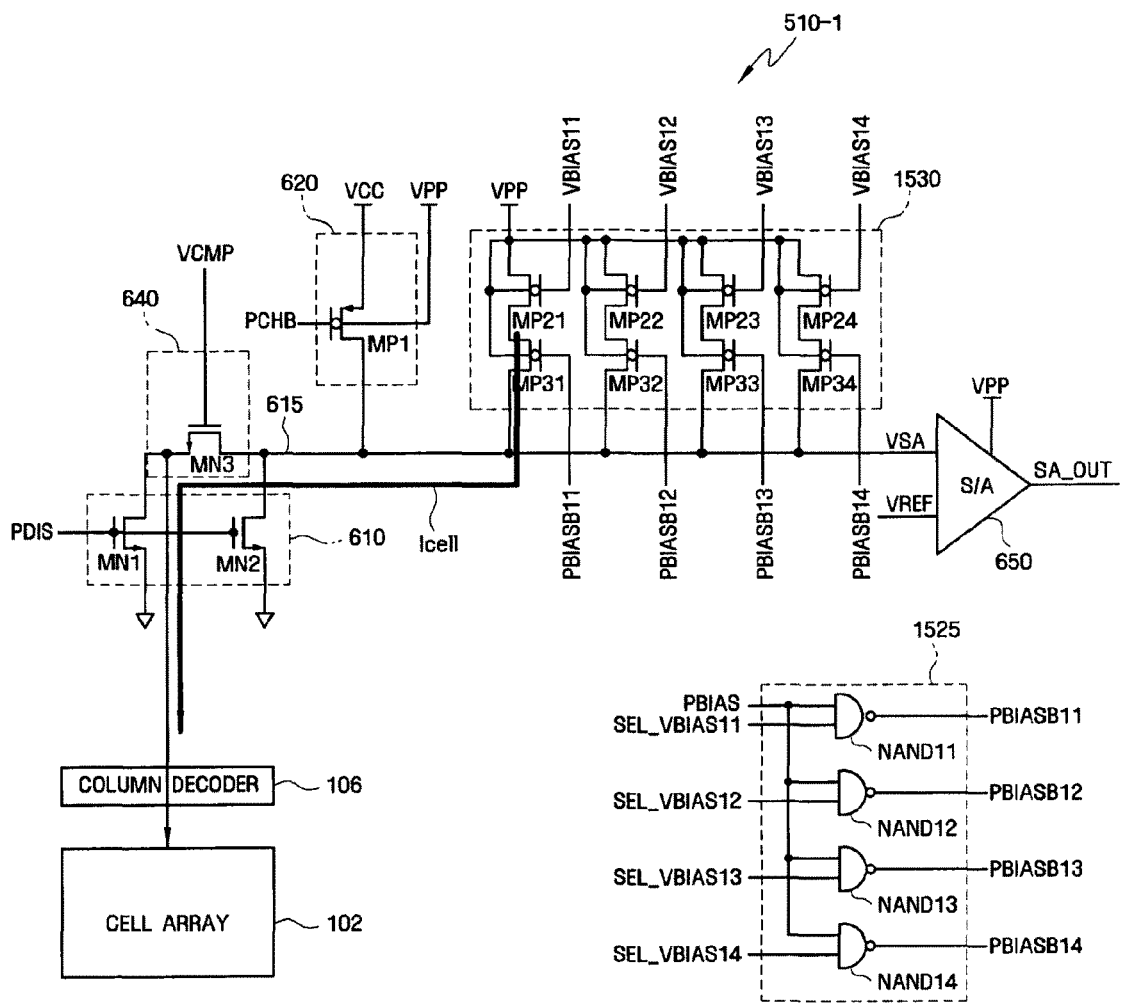
FIG. 16 illustrates a circuit diagram of the read circuit in FIG. 14 according to one embodiment.

FIG. 16 illustrates a circuit diagram of the read circuit 510-1 according to one embodiment. As shown, the read circuit 510-1 is the same as the embodiment of FIG. 6, except that (1) the read bias unit 1530 has replaced the read bias unit 630 and (2) the bias selection unit 1525 has replaced the bias selection unit 625. Accordingly, for the sake of brevity, only these differences will be described in detail.

The read bias unit 1530 includes first and second PMOS transistors MP21 and MP31 connected in series between a power source voltage VPP and the bias application line 615. The first PMOS transistor MP21 receives a first bias VBIAS11 at its gate, and the second PMOS transistor MP31 receives a first program bias PBIAS11 at its gate. The read bias unit 1530 further includes third and fourth PMOS transistors MP22 and MP32 connected in series between the power source voltage VPP and the bias application line 615. The third PMOS transistor MP22 receives a second bias VBIAS12 at its gate, and the fourth PMOS transistor MP32 receives a second program bias PBIAS12 at its gate. The read bias unit 1530 includes fifth and sixth PMOS transistors MP23 and MP33 connected in series between the power source voltage VPP and the bias application line 615. The fifth PMOS transistor MP23 receives a third bias VBIAS13 at its gate, and the sixth PMOS transistor MP33 receives a third program bias PBIAS13 at its gate. The read bias unit 1530 further includes seventh and eighth PMOS transistors MP24 and MP34 connected in series between the power source voltage VPP and the bias application line 615. The seventh PMOS transistor MP24 receives a fourth bias VBIAS14 at its gate, and the eighth PMOS transistor MP34 receives a fourth program bias PBIAS14 at its gate.

Figure 17:
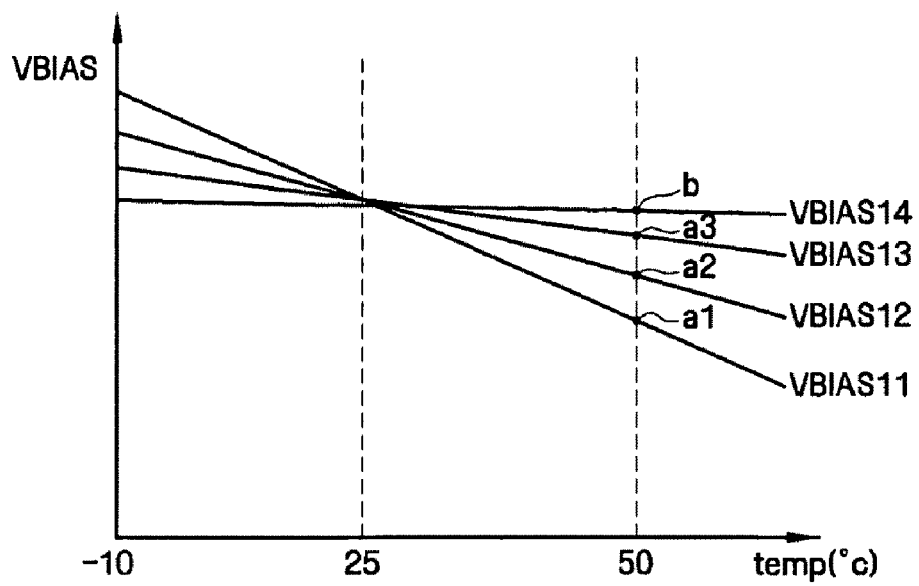
FIG. 17 illustrates examples of the biases VBAIS in FIG. 16.

The dc voltage generator 520-1 supplies the first-fourth biases VBIAS11-VBIAS14. In one embodiment, the fourth bias VBIAS14 is greater than the third bias VBIAS13, the third bias VBIAS13 is greater than the second bias VBIAS12, and the second bias VBIAS12 is greater than the first bias VBIAS11. In another embodiment, the fourth bias VBIAS14 is fixed with respect to temperature, but the first-third biases VBIAS11-VBIAS13 change with temperature. For example, the first-fourth biases VBAIS11-VBIAS14 may be as shown in FIG. 17. In this embodiment, the dc voltage generator 520-1 may be configured using temperature dependent elements to produce the first-fourth biases VBIAS11-VBIAS14 as shown in FIG. 17. Alternatively, a temperature sensor may supply temperature information to the dc voltage generator 520-1, and the dc voltage generator 520-1 may generates the biases as shown in FIG. 17 based on the temperature information.

The bias selection unit 1525 supplies the first-fourth program biases PBIAS11-PBIAS14. In particular, the bias selection unit 1525 includes a first NAND gate NAND11 that inputs a base program bias BPBIAS and the first bias selection signal SEL_VBIAS11, and outputs the first program bias PBIAS11. A second NAND gate NAND12 inputs the base program bias BPBIAS and the second bias selection signal SEL_BIAS12, and outputs the second program bias PBIAS12. A third NAND gate NAND13 inputs the base program bias BPBIAS and the third bias selection signal SEL_BIAS13, and outputs the third program bias PBIAS13. A fourth NAND gate NAND14 inputs the base program bias BPBIAS and the fourth bias selection signal SEL_BIAS14, and outputs the fourth program bias PBIAS14. Accordingly, if one of the first-fourth bias selection signals SEL_BIAS11-SEL_BIAS14 is a logic high voltage, the corresponding program bias PBIAS11-PBIAS14 is a logic low voltage (e.g., a logic "0" voltage). If the one of the first-fourth bias selection signals SEL_BIAS11-SEL_BIAS14 is a logic low voltage, the corresponding program bias PBIAS11-PBIAS14 is a logic high voltage (e.g., logic "1").

As a result, if the first bias selection signal SEL_BIAS11 is logic high, the read bias unit 1530 supplies a first current ICell11 to the bias application line 615 consistent with the first bias VBIAS11. If the second bias selection signal SEL_BIAS12 is logic high, the read bias unit 1530 supplies a second current ICell12 to the bias application line 615 consistent with the second bias VBIAS12. If the third bias selection signal SEL_BIAS13 is logic high, the read bias unit 1530 supplies a third current ICell13 to the bias application line 615 consistent with the second bias VBIAS13. If the fourth bias selection signal SEL_BIAS14 is logic high, the read bias unit 1530 supplies a fourth current ICell14 to the bias application line 615 consistent with the fourth bias VBIAS14. As discussed above, because VBIAS14>VBIAS13>VBIAS12>VBIAS11, the read bias unit 1530 respectively supplies ICell11>ICell12>ICell13>ICell14 to the bias application line 615 depending on which one of the first-fourth bias selection signals SEL_VBIAS11-SEL_VBIAS14 is logic high. The supplied current times the resistance of the read memory cell Cp produces the sensed voltage VSA on the bias application line 615.

As was shown by FIGS. 12, the resistance distributions of the set and reset states change over time. Therefore, by supplying different currents to account for the changes in resistance distribution, (1) the difference in sensed voltage VSA for the set state over time is significantly reduced and (2) the difference in the sensed voltage VSA for the reset state over time is significantly reduced. As such read errors are reduced.

As will be appreciated, while the recovery time period has been divided into three time intervals in the above described embodiment, the present invention is not limited to three intervals. Instead, the recovery time period may be divided into more than three intervals with commensurate changes in the read unit as is readily apparent from the discussion of the above embodiments.

Accordingly, if a currently received read address RADDR matches a write address WADDR, the read unit determines the time interval from the last write operation and supplies a read current based on the determined time interval.

Figure 18:
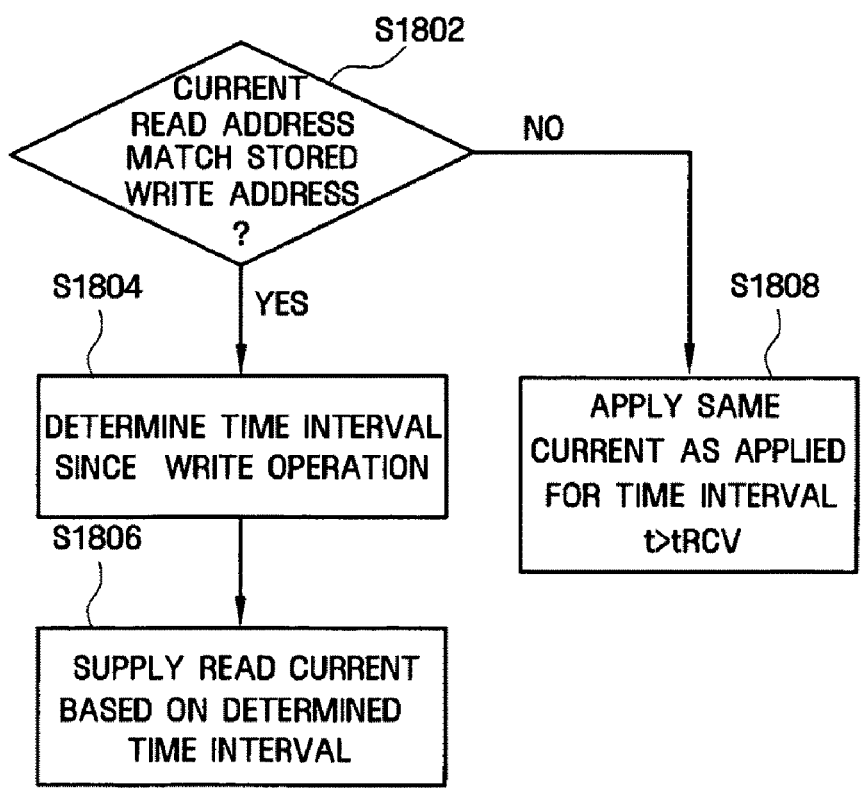
FIG. 18 illustrates a flow chart of a read concept according to another embodiment.

FIG. 18 illustrates a flow chart of the read concept according to one embodiment. As shown, during a read operation, in step S1802, the read unit 110-1 determines if the current read address matches a stored write address. If so, then in step S1804, the read unit 110-1 determines the time interval since the last write operation. For example, with respect to the embodiment of FIG. 14, the read unit 110-1 determines whether the time interval is one of: $0<t<t1$; $t1<t<t2$; $t2<t<tRCV$ and $tRCV<t$. Based on the determined time interval, the read unit 110 applies in step S1806 a corresponding current (e.g., ICell11-Icell14) to the memory cell array 102 in reading data from the memory cell array 102. In step S1802, if the current read address does not match a stored write address, then in step S1808, the read unit 110 applies the same current to the memory cell array 102 as applied for the time interval $t>tRCV$.

Third Embodiment

In the above described embodiments, the recovery time period generally was applied to all the write address locations in the write address buffer 124. However, the present invention is not limited to the use of a single recovery time period for all of the write address locations. Instead, a recovery time period may be kept for each write address location of the write address buffer 124. Or as a further alternative, a recovery time period may be kept for groups or subsets of write address locations or entries, where the groups or subsets include more than one entry. It will be understood, however, that a subset may include a single or multiple members.

Figure 19:
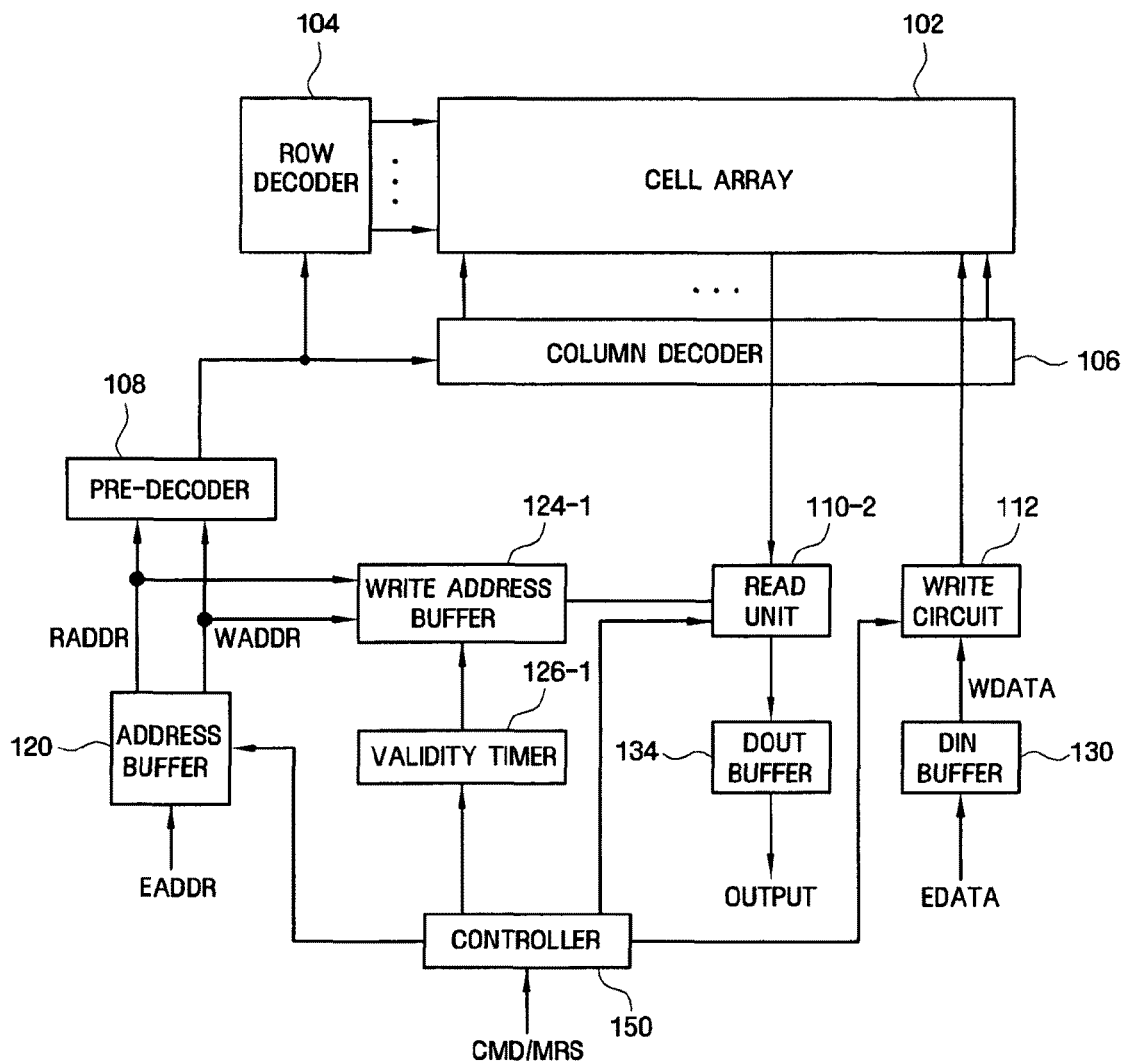
FIG. 19 illustrates a semiconductor device according to a further embodiment.

FIG. 19 illustrates a semiconductor device according to another embodiment. The embodiment of FIG. 19 is the same as FIG. 1 except that the write address buffer 124 has been replaced with a write address buffer 124-1, the read unit 110 has been replaced with a read unit 110-2, and the validity timer 126 has been replaced with a validity timer 126-1.

Figure 20:
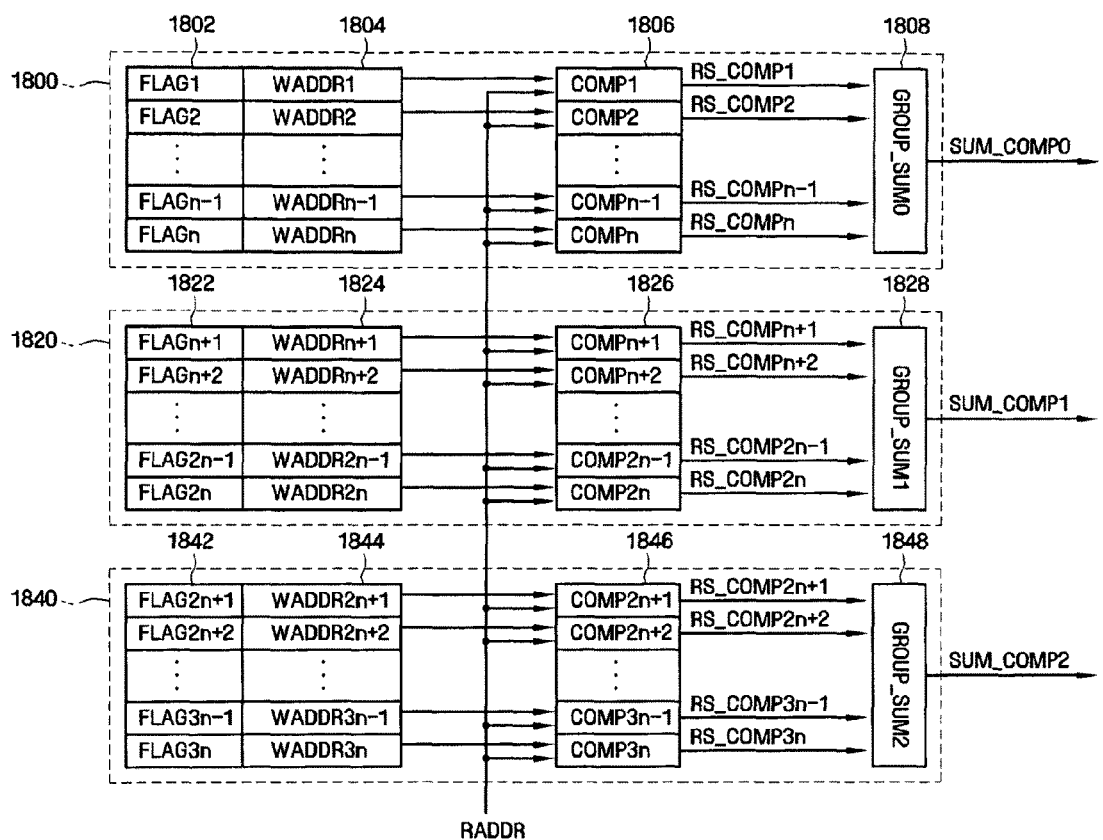
FIG. 20 an embodiment of the write address buffer in FIG. 19.

FIG. 20 illustrates an example of a write address buffer according to this embodiment. In particular, FIG. 20 illustrates an example write address buffer 124-1 in which the write address buffer has been divided into 3 write address buffer units 1800, 1820 and 1840. Accordingly, the write address locations or entries have been divided into three subsets or groups of n entries in each write address buffer unit 1800, 1820 and 1840; where n is an integer greater than 1. It will be understood that the write address buffer 124-1 may divided into more or less write address buffer units than 3. It will be further understood that the write address buffer units may include different numbers of entries. As with the write address buffer 124, the entries of write address buffer 124-1 are filled sequentially until all entries are filled, and then the entries are overwritten sequentially in the same manner.

Since each write address buffer unit 1800, 1820 and 1840 has a same structure, only the write address buffer unit 1800 will be described for the sake of brevity. Write addresses are stored in entries 1804 of the write address buffer unit 1800, and each entry 1804 has an associated validity flag 1802. When the write address buffer unit 1800 stores a write address in an entry 1804, the write address buffer unit 1800 sets the validity flag 1802 associated with the entry 1804 to "1". This indicates the entry 1804 is valid. Validity flags 1802 are reset based on output from a validity timer 126-1 shown in FIG. 19.

The validity timer 126-1 measures a set period of time referred to as the validity time period for each of the write address buffer units in the write address buffer 124-1. Measuring or counting down of the time period for a write address buffer unit restarts (or resets) with each receipt of a write command from the controller 150 that results in a write address being stored in the write address buffer unit. Accordingly, consecutively received write addresses in a write address buffer unit cause successive resetting of the validity time period for that write address buffer unit such that the validity time period expires after the set period of time from the last received write command. However, receipt of a write address in another write address buffer unit does not affect the validity time period. The validity timer 126-1 informs the write address buffer 124-1 of the validity time periods or at least expiration of the validity time periods for the write address buffer units via validity timing signals VTs. In response to expiration of the corresponding validity time period, the write address buffer unit sets the validity flags for each entry to "0," which indicates the entries are not valid. In one embodiment, each validity time period is set equal to or longer than a period of time for data written into the memory cell array 102 to settle or stabilize. For example, each validity time period may be set longer than the expected settling time by a desired margin to account for manufacturing variations. Each validity time period may be programmable by applying a command or mode register set such that, in response, the controller 150 programs a received desired validity time in the validity timer 126-1. Each validity time period may also be set in other ways such as through fuses, etc.

During a read operation, the read address RADDR supplied to the pre-decoder 108 by the address buffer 120 is also supplied to the write address buffer units 1800, 1820 and 1840. As shown in FIG. 19, the write address buffer unit 1800 includes a comparator 1806 associated with each entry 1804 in the write address buffer unit 1800. Each comparator 1806 compares the write address WADDR stored in the corresponding entry 1804 with the received read address RADDR, and generates a comparison result RS_COMPi, for i=0 to n. In one embodiment, the comparison result RS_COMP is a logic "1" if the read and write addresses match, and is a logic "0" if the read and write addresses do not match. A summer 1808 performs a logical OR operation on the output from the comparators 1806 to generate a composite comparison result SUM_COMP0. Namely, if the read address RADDR matches at least one write address WADDR, then the composite comparison result SUM_COMP0 will be a logic "1"; otherwise, the composite comparison result SUM_COMP0 will be a logic "0". The write address buffer units 1820 and 1840 produce comparison results SUM_COMP1 and SUM_COMP2, respectively, in the same manner.

Figure 21:
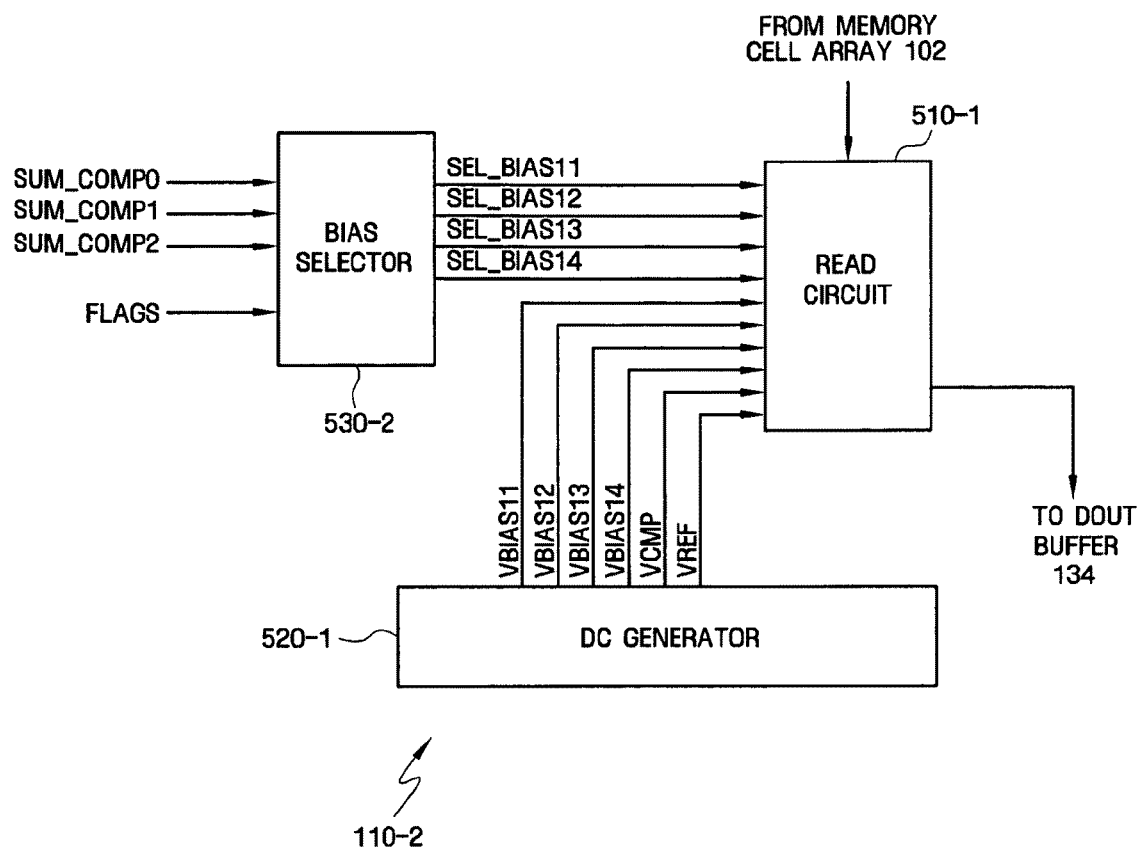
FIG. 21 illustrates one embodiment of the read unit in FIG. 19.

FIG. 21 illustrates an example embodiment of the read unit in FIG. 19. As shown, the read unit 110-2 is the same as the read unit 110-1 shown in FIG. 14 except that the bias selector 530-1 has been replaced with a bias selector 530-2. Accordingly, for the sake of brevity, only the differences between the read unit 110-2 and the read unit 110-1 will be described.

Figure 22:
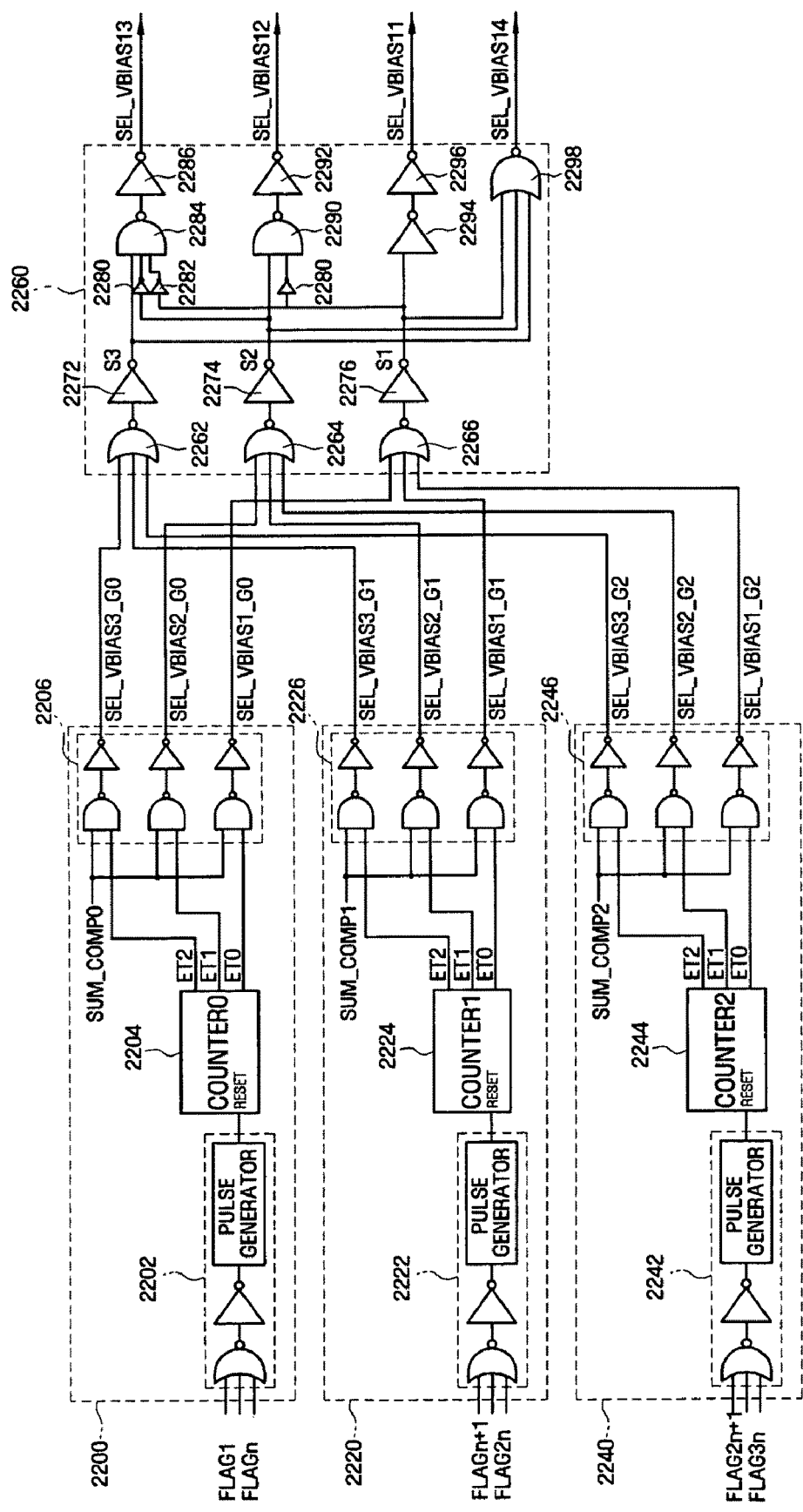
FIG. 22 illustrates one embodiment of the bias selector in FIG. 21.

FIG. 22 illustrates an example embodiment of the bias selector in FIG. 21. As shown, the bias selector includes first, second and third bias selector units 2200, 2220 and 2240. The first, second and third bias selection units 2200, 2220 and 2240 have the same structure and only differ in the signals received. Namely, the first bias selector unit 2200 receives the first through nth validity flags FLAG1-FLAGn and the first composite comparison result SUM_COMP0. The second bias selector unit 2220 receives the (n+1)th though 2nth validity flags FLAGn+1 to FLAG2n and the second composite comparison result SUM_COMP1. The third bias selector unit 2240 receives the (2n+1)th through 3nth validity flags FLAG2n+1 to FLAG3n and the third composite comparison result SUM_COMP2.

The first, second and third bias selection units 2200, 2220 and 2240 each have a reset unit 2202, 2222 and 2242, respectively, that are configured and operate in the same manner as the reset unit 910 in the embodiment of FIG. 15. Similarly, the first, second and third bias selection units 2200, 2220 and 2240 each have a counter 2204, 2224, and 2244, respectively, that are configured and operate in the same manner as the counter 920-1 in FIG. 15. Still further, the first, second and third bias selection units 2200, 2220 and 2240 each have a bias selection signal generator 2206, 2226 and 2246, respectively, that are configured to and generate intermediate first, second and third selection signals in the same manner as the bias selection signal generator 930-1 of FIG. 15 generated bias selection signals. Namely, the bias selection signal generators 2206, 2226 and 2246 differ from the bias selection signal generator 930-1 in that a fourth selection signal SEL_VBIAS14 is not generated. However, the intermediate bias selections signals SEL_VBIAS1_G0, SEL_VBIAS2_G0, and SEL_VBIAS3_G0 generated by the first bias selection signal generator 2206 correspond to the bias selection signals SEL_VBIAS11, SEL_VBIAS12, and SEL_VBIAS13 generated by the bias selection signal generator 930-1. Similarly, the intermediate bias selections signals SEL_VBIAS1_G1, SEL_VBIAS2_G1, and SEL_VBIAS3_G1 generated by the second bias selection signal generator 2226 correspond to the bias selection signals SEL_VBIAS11, SEL_VBIAS12, and SEL_VBIAS13 generated by the bias selection signal generator 930-1. And, the intermediate bias selections signals SEL_VBIAS1_G2, SEL_VBIAS2_G2, and SEL_VBIAS3_G2 generated by the third bias selection signal generator 2246 correspond to the bias selection signals SEL_VBIAS11, SEL_VBIAS12, and SEL_VBIAS13 generated by the bias selection signal generator 930-1. In view of the above, configuration and operation of the first, second and third bias selection units 2200, 2220 and 2240 is readily apparent from the description of the bias selector of FIG. 15; and a detailed description thereof will not be repeated for the sake of brevity.

The bias selector 530-2 also includes a composite selection signal generator 2260. The composite selection signal generator 2260 includes first, second and third NOR gates 2262, 2264 and 2266. The first NOR gate 2262 NORs the intermediate bias selection signals SEL_VBIAS1_G0, SEL_VBIAS1_G1, and SEL_VBIAS1_G2. The second NOR gate 2264 NORs the intermediate bias selection signals SEL_VBIAS2_G0, SEL_VBIAS2_G1, and SEL_VBIAS2_G2. The third NOR gate 2266 NORs the intermediate bias selection signals SEL_VBIAS3_G0, SEL_VBIAS3_G1, and SEL_VBIAS3_G2. First, second and third inverters 2272, 2274 and 2276 respectively invert the output from the first, second and third NOR gates 2262, 2264 and 2266 to produce composite intermediate signals S3, S2 and S1. According, intermediate signal S1 will be logic "1" if any of SEL_VBIAS1_G0, SEL_VBIAS1_G1, SEL_VBIAS1_G2 are logic "1"; otherwise, composite intermediate signal S1 will be logic low. Similarly, composite intermediate signal S2 will be logic "1" if any of SEL_VBIAS2_G0, SEL_VBIAS2_G1, SEL_VBIAS2_G2 are logic "1"; otherwise, composite intermediate signal S2 will be logic low. And, composite intermediate signal S3 will be logic "1" if any of SEL_VBIAS3_G0, SEL_VBIAS3_G1, SEL_VBIAS3_G2 are logic "1"; otherwise, composite intermediate signal S3 will be logic low.

Inverters 2280 and 2282 invert composite intermediate signals S2 and S1, respectively, and a NAND gate 2284 NANDs the composite intermediate signal S3 with the output of the inverters 2280 and 2282. An inverter 2286 inverts the output from the NAND gate 2284 to produce the third bias selection signal SEL_VBIAS13.

An inverter 2288 inverts the composite intermediate signal S1, and a NAND gate 2290 NANDs the composite intermediate signal S2 with the output of the inverter 2288 to produce the second bias selection signal SEL_VBIAS12. An inverter 2294 inverts the composite intermediate signal S1, and an inverter 2296 inverts the output from the inverter 2294 to produce the first bias selection signal SEL_VBIAS11.

Also, a NAND gate 2298 NANDs each of the composite intermediate signals S1, S2 and S3 to produce the fourth bias selection signal SEL_VBIAS14.

With respect to the composite intermediate signals S1, S2 and S3, FIG. 23 illustrates the logic state of the first-fourth bias selection signals SEL_VBIAS11-SEL_VBIAS14. From FIG. 23, it will be appreciated that the fourth bias selection signal SEL_VBIAS14 is a logic "1" if none of the composite intermediate signals S1, S2 and S3 are a logic "1". Also, if the composite intermediate signal S1 is a logic "1", then the first bias selection signal is a logic "1", and the other bias selection signals are logic "0". If the composite intermediate signal S1 is logic "0", then the second bias selection signal is logic "1" and the other bias selection signals are logic "0" if the composite intermediate signal S2 is logic "1." If the composite intermediate selection signals S1 and S2 are logic "0", then the third bias selection signal SEL_VBIAS3 is logic "1" and the other bias selection signals are "0" if the composite intermediate signal S3 is logic "1."

Figure 24:
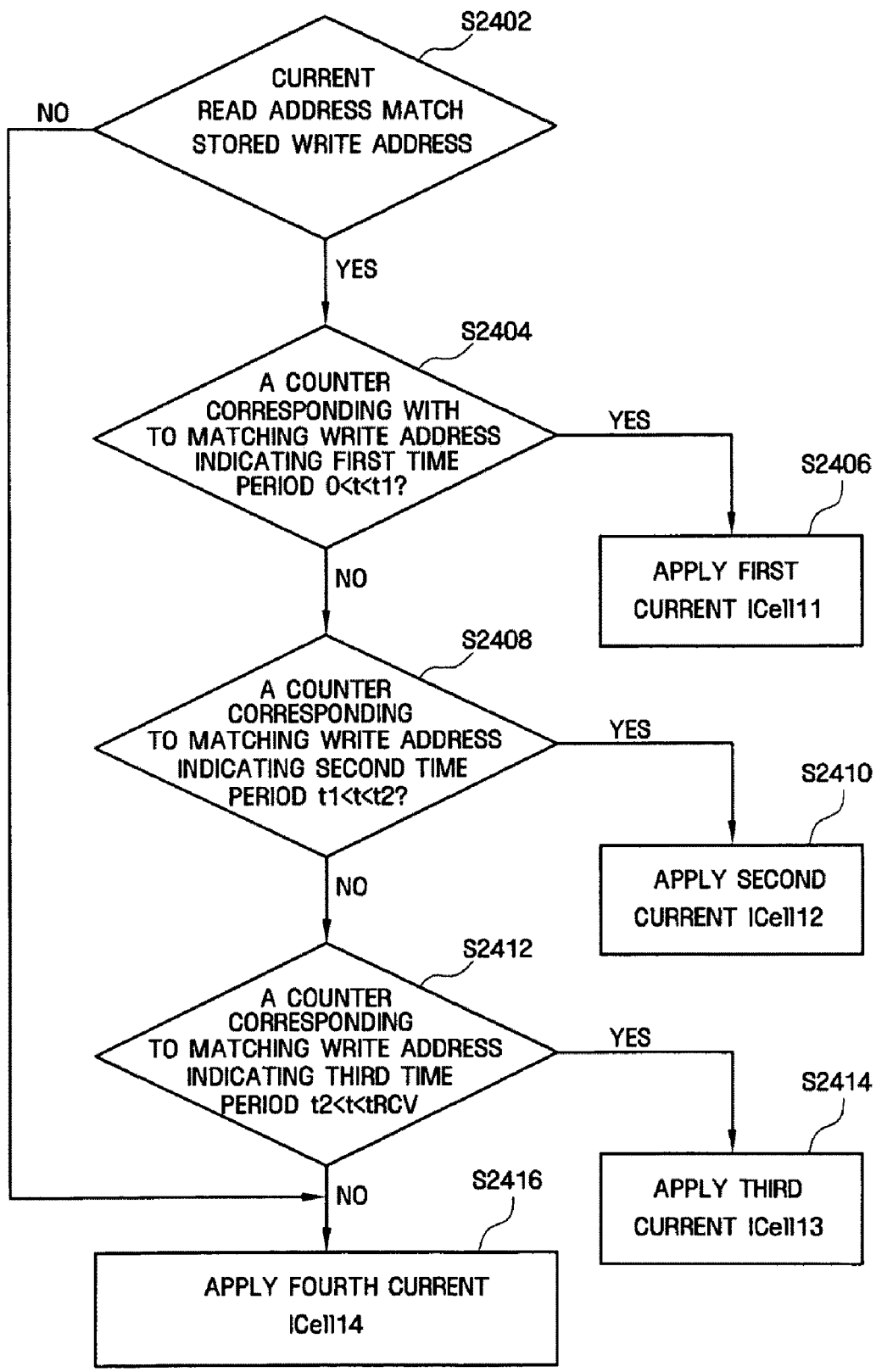
FIG. 24 illustrates a flow chart of a read concept according to further embodiment.

As discussed above, the read circuit 510-1 is configured and operates in the same manner as described above with respect to FIG. 16. Accordingly, the read circuit 510-1 operates according to the flow chart of FIG. 24. Namely, in step S2402 if the current read address RADDR matches a stored write address WADDR then the first current ICell11 consistent with the first bias VBIAS11 is applied in step S2406 to the memory cell array 102 if any of the counters 2204, 2224 and 2244 associated with the matching write address indicate the time period 0<t<t1 in step S2404. If step S2406 is negative, then the second current ICell12 consistent with the second bias VBIAS12 is applied in step S2410 to the memory cell array 102 if any of the counters 2204, 2224 and 2244 associated with the matching write address indicate the time period t1<t<t2 in step S2408. If step S2408 is negative, then the third current ICell13 consistent with the third bias VBIAS13 is applied in step S2414 to the memory cell array 102 if any of the counters 2204, 2224 and 2244 associated with the matching write address indicate the time period t2<t<tRCV in step S2412. If step S2412 or step S2402 is negative, then the fourth current ICell14 consistent with the fourth bias VBIAS14 is applied to the memory cell array 102 in step S2416. It will be recalled that ICell11>ICell12>ICell13>ICell14, and the supplied current times the resistance of the read memory cell Cp produces the sensed voltage VSA on the bias application line 615.

Fourth Embodiment

Figure 25:
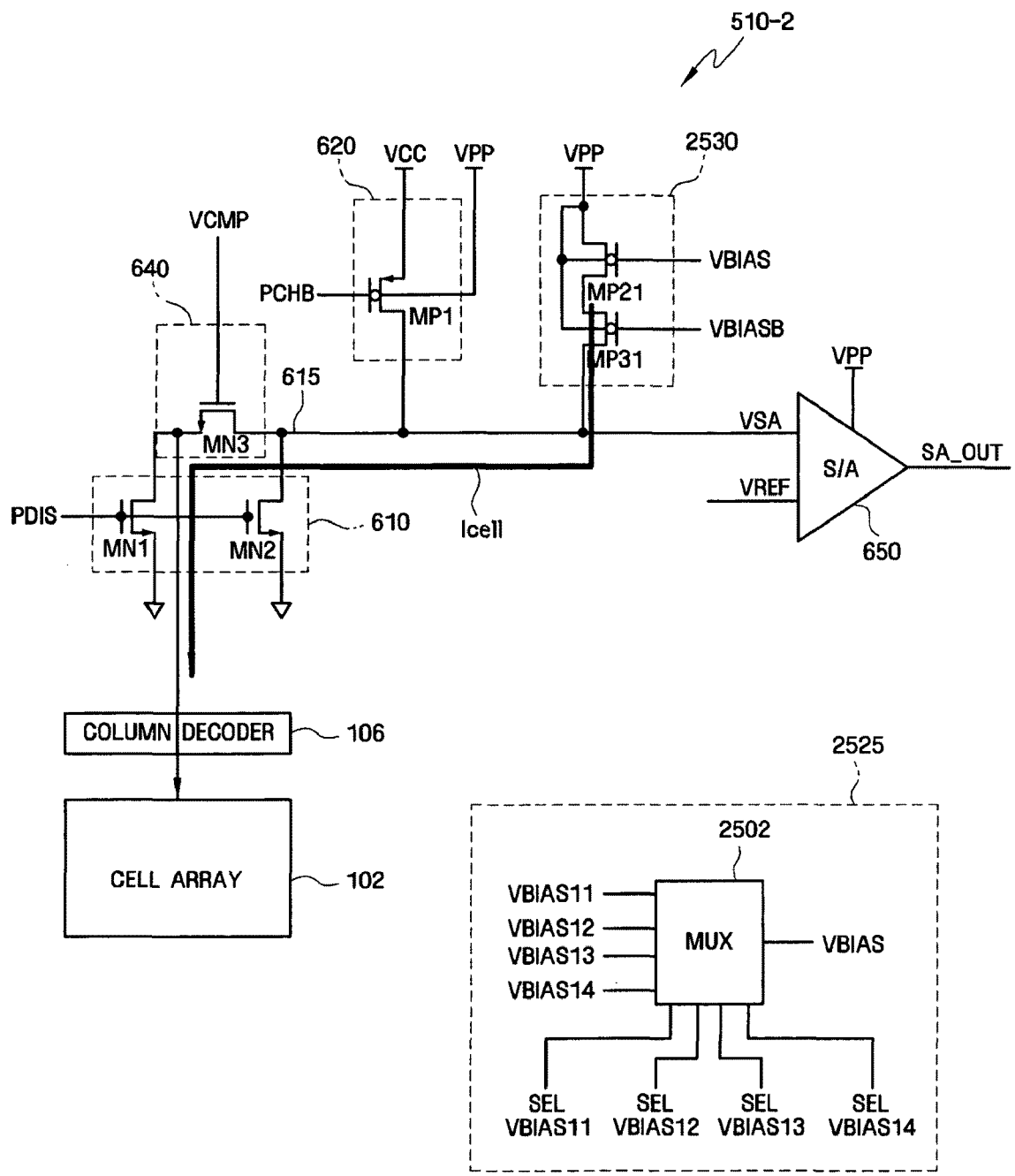
FIG. 25 illustrates a circuit diagram of the read circuit according to another embodiment.

FIG. 25 illustrates a different embodiment of a read circuit that may be applied to the second and third embodiments described above. In particular, the read circuit 510-2 illustrated in FIG. 25 may replace the read circuit 510-1 illustrated in FIGS. 14 and 16. The read circuit 510-2 of FIG. 25 is the same as the read circuit 510-1 of FIG. 16, except that a read bias unit 2530 has replaced the read bias unit 1530 and the bias selection unit 2525 has replaced the bias selection unit 1525. For the sake of brevity, only these differences will be described in detail.

As shown, the read bias unit 2530 includes PMOS transistors MP25 and MP35 connected in series between the power supply voltage VPP and the bias application line 615. The PMOS transistor MP35 receives the base program bias PBIASB at its gate, and the PMOS transistor MP25 receives the bias VBIAS output from the bias selection unit 2525 at its gate.

The bias selection unit 2525 includes a multiplexer 2502 that outputs one of the first-fourth biases VBIAS11-VBIAS14 as the bias VBIAS based on the first-fourth bias selection signals SEL_VBIAS11-SEL_VBIAS14. In particular, if the first bias selection signal SEL_VBIAS11 is logic "1", multiplexer 2502 outputs the first bias VBIAS11 as the bias VBIAS. If the first bias selection signal SEL_VBIAS11 is logic "0" and the second bias selection signal SEL_VBIAS12 is logic "1", the multiplexer 2502 outputs the second bias VBIAS12 as the bias VBIAS. If the first and second bias selection signals SEL_VBIAS11 and SEL_VBIAS12 are logic "0" and the third bias selection signal SEL_VBIAS13 is logic "1", the multiplexer 2502 outputs the third bias VBIAS13 as the bias VBIAS. If the first-third bias selection signals SEL_VBIAS11-SEL_VBIAS13 are logic "0" and the fourth bias selection signal SEL_VBIAS14 is logic "1", the multiplexer 2502 outputs the fourth bias VBIAS14 as the bias VBIAS.

Accordingly, the read circuit 510-2 applies the same currents to memory cell array 102 under the same conditions as described above with respect to the second and third embodiments. Namely, the second and third embodiments operate in the same manner as described above with the read circuit 510-2.

Fifth Embodiment

Figure 26:
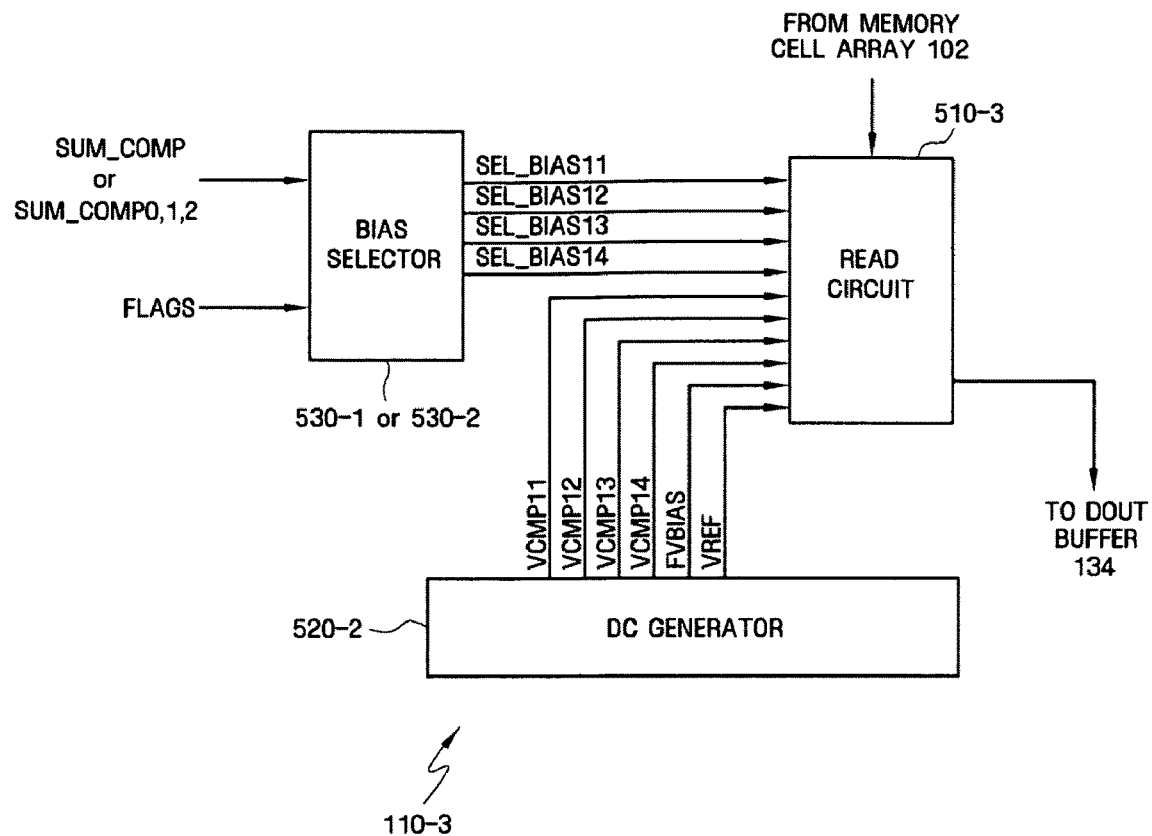
FIG. 26 illustrates a read unit according to another embodiment.

FIG. 26 illustrates a different embodiment of a read unit that may be applied to the second and third embodiments described above. In particular, the read unit 110-3 illustrated in FIG. 26 may replace the read units 110-1 and 110-2 illustrated in FIGS. 13 and 19. As shown, the read unit 110-3 includes a bias selector, which may be either the bias selector 530-1 or the bias selector 530-2 described above.

A read circuit 510-3 receives the first-fourth bias selection signals SEL_VBIAS11-SEL_VBIAS14 from the bias selector 530-1 or 530-2. In addition, the read circuit 510-3 receives first-fourth clamp control signals VCMP11, VCMP12, VCMP13 and VCMP14, a fixed bias FVBIAS and the reference voltage VREF from a dc generator 520-2. These voltages generated by the dc generator 520-2 will be described in more detail with respect to the description of the read circuit 510-3.

Figure 27:
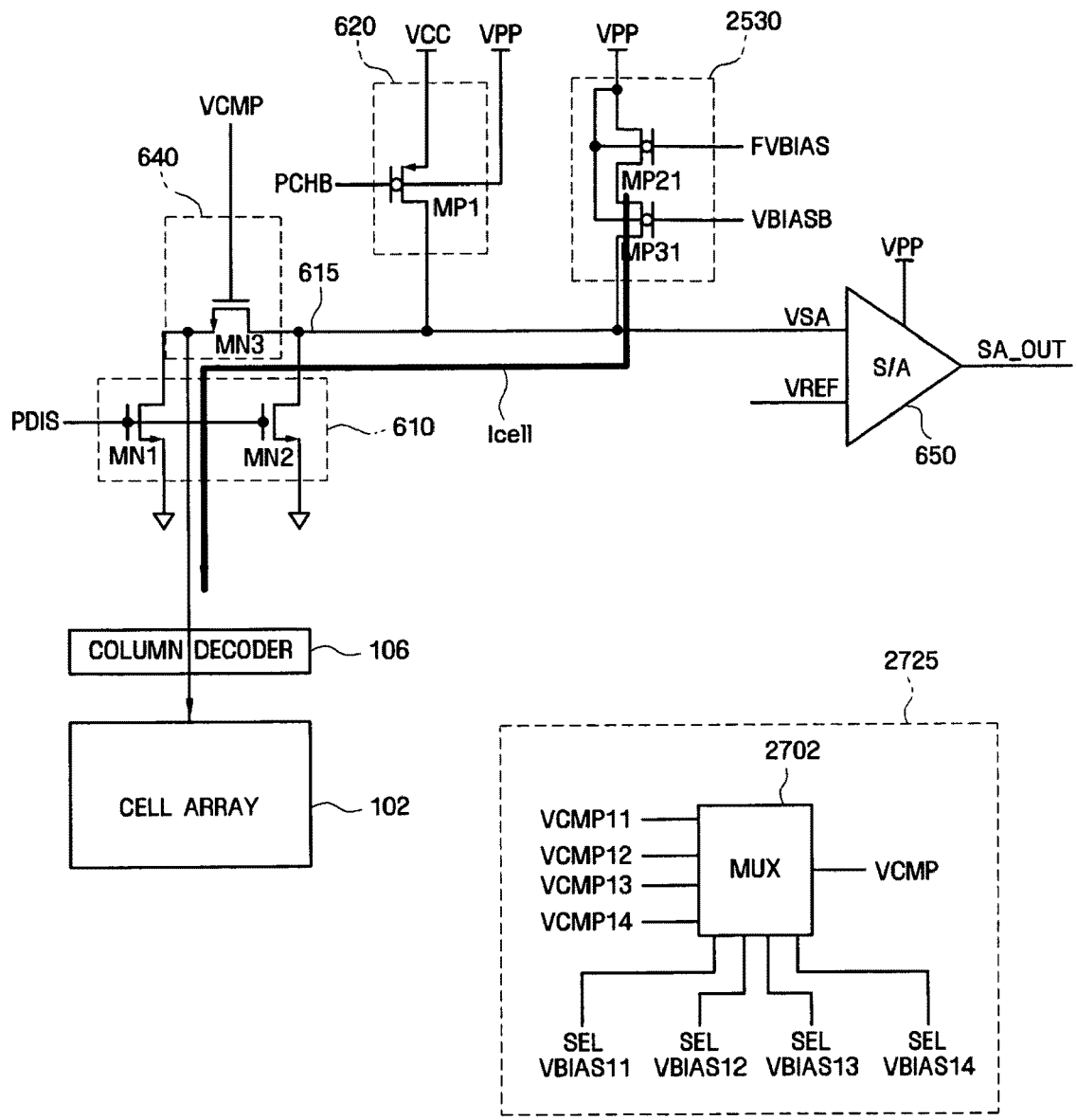
FIG. 27 illustrates an embodiment of the read circuit in the read unit of FIG. 26.

FIG. 27 illustrates an embodiment of the read circuit in FIG. 26. As shown, the read circuit 510-3 is the same as the read circuit 510-2 shown in FIG. 25 except that the bias selection circuit 2525 has been replaced with a clamp control signal selection circuit 2725. It should also be noted that the read bias unit 2530 receives a fixed bias FVBIAS from the dc generator 520-2. For the sake of brevity, only these differences will be described in detail.

In prior embodiments, the amount of current applied to the memory cell array 102 was controlled by controlling operation of the read bias unit in the read circuit. In this embodiment, instead of controlling the operation of the read bias unit 2530, operation of the current clamping unit 640 is controlled.

The clamp control signal selection circuit 2725 includes a multiplexer 2702 that outputs one of the first-fourth clamp control signals VCMP11-VCMP14 as the clamp control signal VCMP based on the first-fourth bias selection signals SEL_VBIAS11-SEL_VBIAS14. In particular, if the first bias selection signal SEL_VBIAS11 is logic "1", multiplexer 2702 outputs the first clamp control signal VCMP11 as the clamp control signal VCMP. If the first bias selection signal SEL_VBIAS11 is logic "0" and the second bias selection signal SEL_VBIAS12 is logic "1", the multiplexer 2702 outputs the second clamp control signal VCMP12 as the clamp control signal VCMP. If the first and second bias selection signals SEL_VBIAS11 and SEL_VBIAS12 are logic "0" and the third bias selection signal SEL_VBIAS13 is logic "1", the multiplexer 2702 outputs the third clamp control signal VCMP13 as the clamp control signal VCMP. If the first-third bias selection signals SEL_VBIAS11-SEL_VBIAS13 are logic "0" and the fourth bias selection signal SEL_VBIAS14 is logic "1", the multiplexer 2702 outputs the fourth clamp control signal VCMP14 as the clamp control signal VCMP.

The dc generator 530-2 generates the fixed bias FVBIAS and the first clamp control signal VCMP11 such that the current applied to the memory cell array is the same as applied by the read circuit 510-2 if the multiplexer 2502 outputs the first bias VBIAS1. The dc generator 530-2 generates the fixed bias FVBIAS and the second clamp control signal VCMP12 such that the current applied to the memory cell array is the same as applied by the read circuit 510-2 if the multiplexer 2502 outputs the second bias VBIAS2. The dc generator 530-2 generates the fixed bias FVBIAS and the third clamp control signal VCMP13 such that the current applied to the memory cell array is the same as applied by the read circuit 510-2 if the multiplexer 2502 outputs the third bias VBIAS3. The dc generator 530-2 generates the fixed bias FVBIAS and the fourth clamp control signal VCMP14 such that the current applied to the memory cell array is the same as applied by the read circuit 510-2 if the multiplexer 2502 outputs the fourth bias VBIAS4. In view of the above, it will be appreciated that read circuit 510-3 achieves the same results and advantages as discussed above with respect previous embodiments.

Sixth Embodiment

Figure 28:
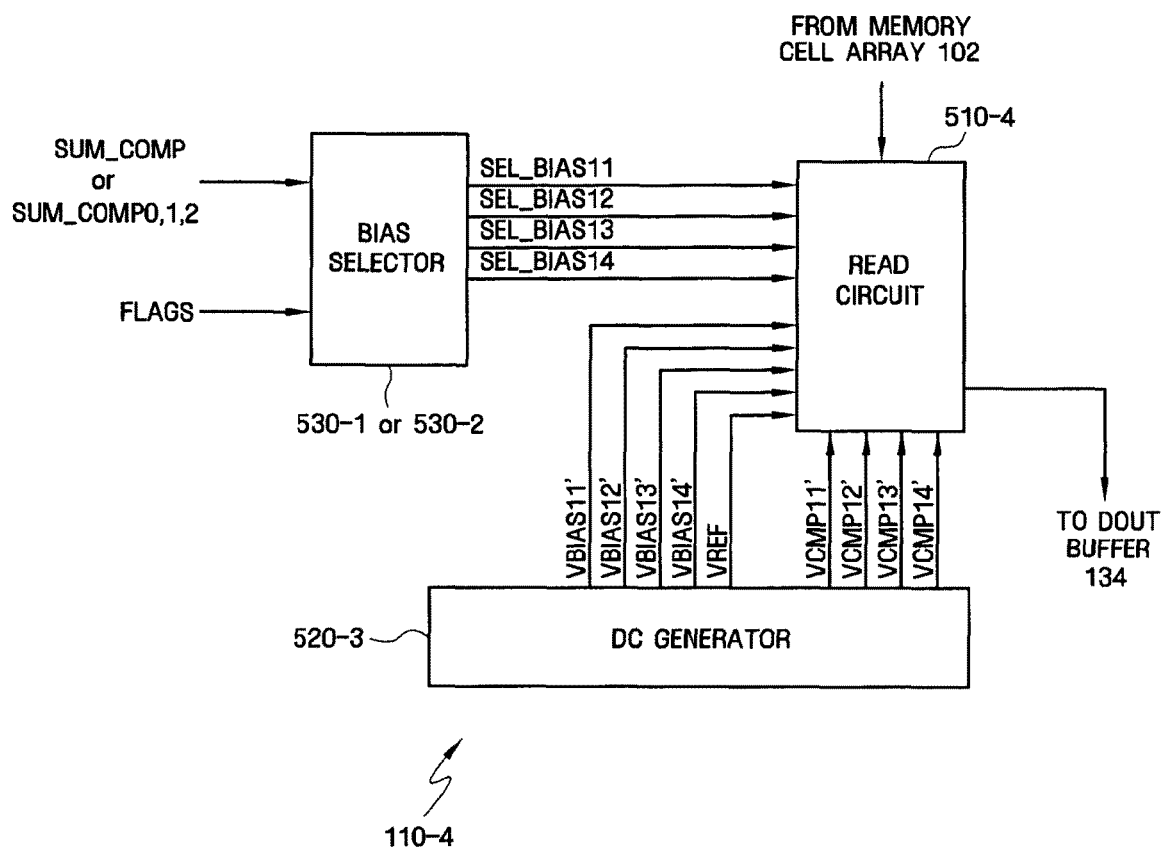
FIG. 28 illustrates a read unit according to a further embodiment.

FIG. 28 illustrates a different embodiment of a read unit that may also be applied to the second and third embodiments described above. In particular, the read unit 110-4 illustrated in FIG. 28 may replace the read units 110-1 and 110-2 illustrated in FIGS. 13 and 19. As shown, the read unit 110-4 includes a bias selector, which may be either the bias selector 530-1 or the bias selector 530-2 described above.

A read circuit 510-4 receives the first-fourth bias selection signals SEL_VBIAS11-SEL_VBIAS14 from the bias selection 530-1 or 530-2. In addition, the read circuit 510-4 receives first-fourth clamp control signals VCMP11'-VCMP14', first-fourth biases VBIAS11'-VBIAS14' and the reference voltage VREF from a dc generator 520-3. These voltages generated by the dc generator 520-3 will be described in more detail with respect to the description of the read circuit 510-4.

Figure 29:
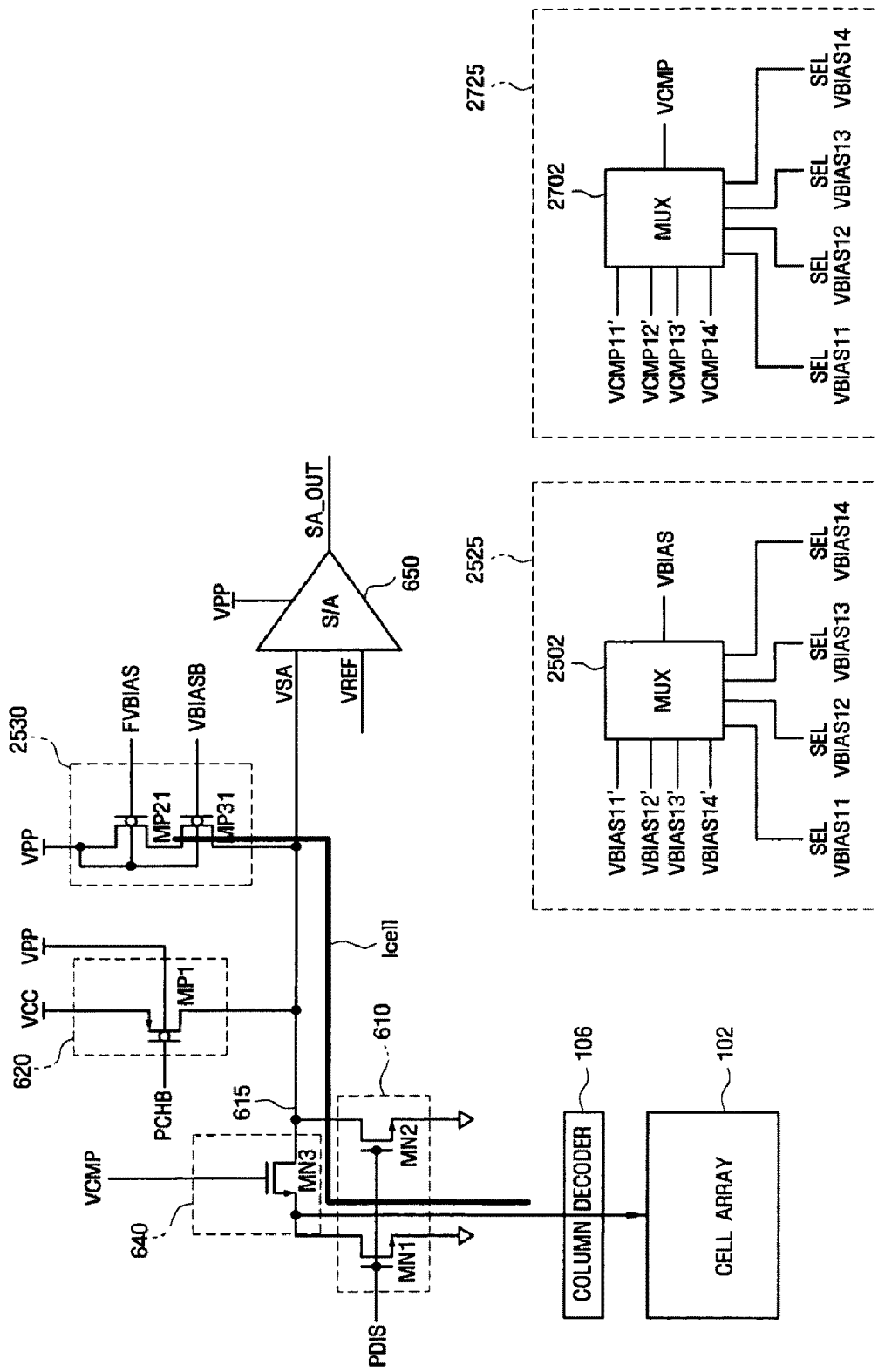
FIG. 29 illustrates an embodiment of the read circuit in the read unit of FIG. 28.

FIG. 29 illustrates an embodiment of the read circuit in FIG. 28. As shown, the read circuit 510-4 is the same as the read circuit 510-3 shown in FIG. 27 except the read circuit 510-4 also includes the bias selection circuit 2525. For the sake of brevity, only these differences will be described in detail.

In prior embodiments, the amount of current applied to the memory cell array 102 was controlled by controlling operation of the read bias unit in the read circuit. Alternatively, in prior embodiments, the amount of current applied to the memory cell array 102 was controlled by controlling operation of the current clamping unit 640. This embodiment combines both forms of controlling the application of current. Namely, the operations of the read bias unit and the current clamping unit are jointly controlled.

Accordingly, each of the components in the read circuit 110-4 has been described above and operate in the same manner as described above. However, the dc generator 520-3 generates the fixed bias FVBIAS, the first bias VBIAS11' and the first clamp control signal VCMP11' such that the current applied to the memory cell array 102 is the same as applied by the read circuit 510-2 if the multiplexer 2502 outputs the first bias VBIAS1. The dc generator 530-2 generates the fixed bias FVBIAS, the second bias VBIAS12' and the second clamp control signal VCMP12' such that the current applied to the memory cell array 102 is the same as applied by the read circuit 510-2 if the multiplexer 2502 outputs the second bias VBIAS2. The dc generator 530-2 generates the fixed bias FVBIAS, the third bias VBIAS13' and the third clamp control signal VCMP13' such that the current applied to the memory cell array 102 is the same as applied by the read circuit 510-2 if the multiplexer 2502 outputs the third bias VBIAS3. The dc generator 530-2 generates the fixed bias FVBIAS, the fourth bias VBIAS4' and the fourth clamp control signal VCMP14' such that the current applied to the memory cell array 102 is the same as applied by the read circuit 510-2 if the multiplexer 2502 outputs the fourth bias VBIAS4. In view of the above, it will be appreciated that read circuit 510-4 achieves the same results and advantages as discussed above with respect previous embodiments.

Application Embodiments

Figure 30:
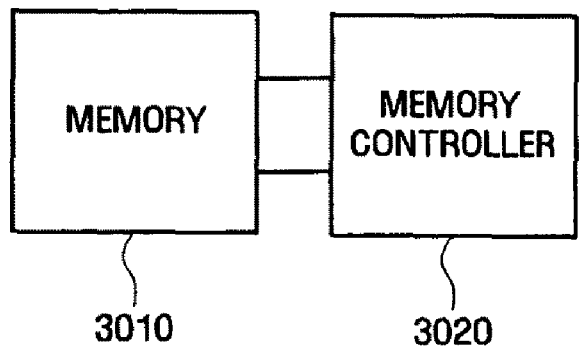
FIGS. 30-35 illustrate example embodiments of applications of the semiconductor device.

FIG. 30 illustrates an example embodiment of an application of the semiconductor device. As shown, this embodiment includes a memory 3010 connected to a memory controller 3020. The memory 3010 may be any of the semiconductor device embodiments described above. The memory controller 3020 supplies the input signals for controlling operation of the memory 3010. For example, the memory controller 3020 supplies the command CMD and address signals.

Figure 31:
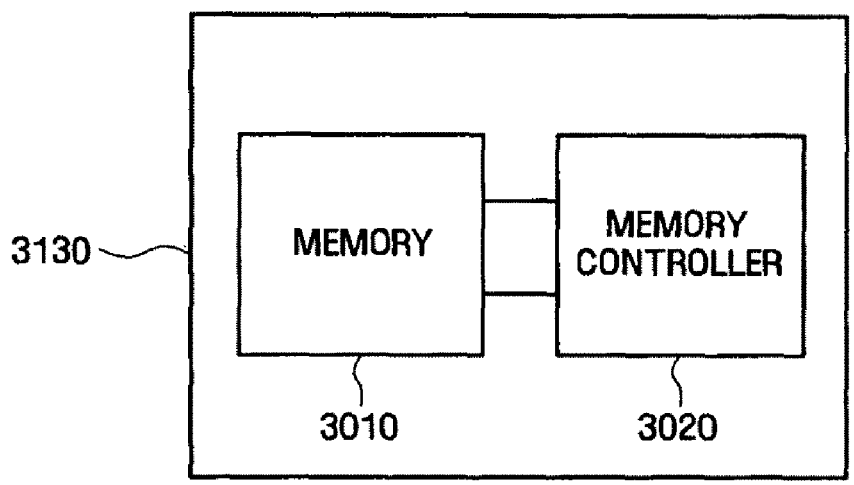

FIG. 31 illustrates yet another embodiment. This embodiment is the same as the embodiment of FIG. 30, except that the memory 3010 and memory controller 3020 have been embodied as a card 3130. For example, the card 3130 may be a memory card such as a flash memory card. Namely, the card 3130 may be a card meeting any industry standard for use with a consumer electronics device such as a digital camera, personal computer, etc. It will be appreciated that the memory controller 3020 may control the memory 3010 based on controls signals received by the card 3130 from another (e.g., external) device.

Figure 32:
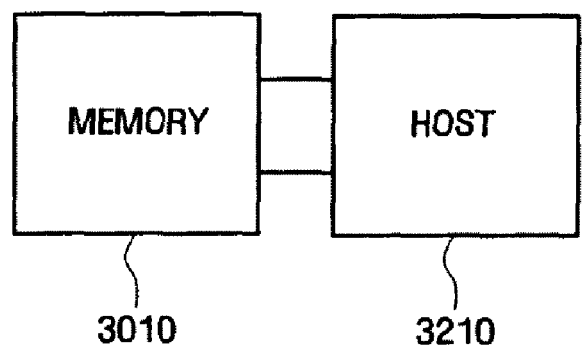

FIG. 32 illustrates a still further embodiment of the present invention. As shown, the memory 3010 may be connected with a host system 3210. The host system 3210 may be a processing system such as a personal computer, digital camera, etc. The host system 3210 may use the memory 3010 as a removable storage medium. As will be appreciated, the host system 3210 supplies the input signals for controlling operation of the memory 3010. For example, the host system 3210 supplies the command CMD and address signals.

Figure 33:
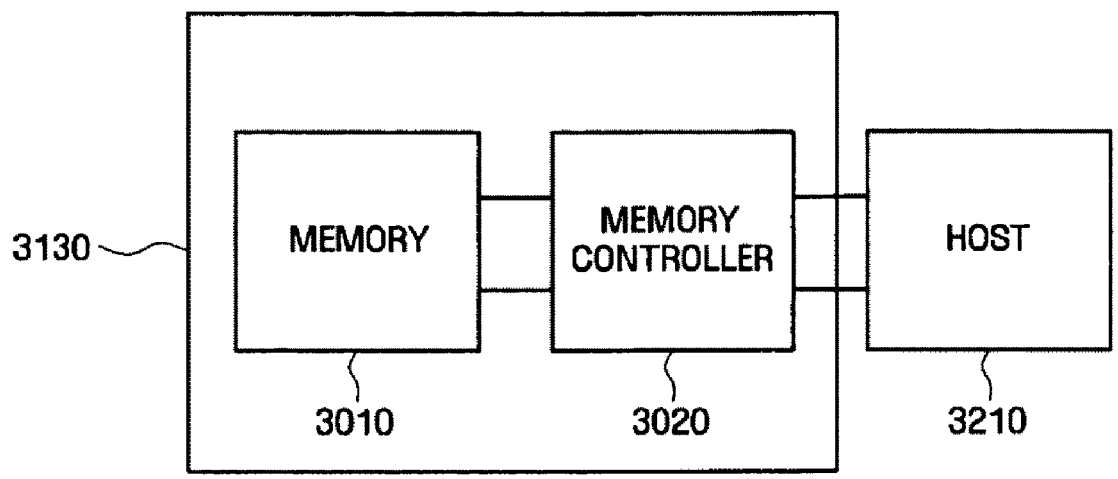

FIG. 33 illustrates an embodiment of the present invention in which the host system 3210 is connected to the card 3130 of FIG. 31. In this embodiment, the host system 3210 applies control signals to the card 3130 such that the memory controller 3020 controls operation of the memory 3010.

Figure 34:
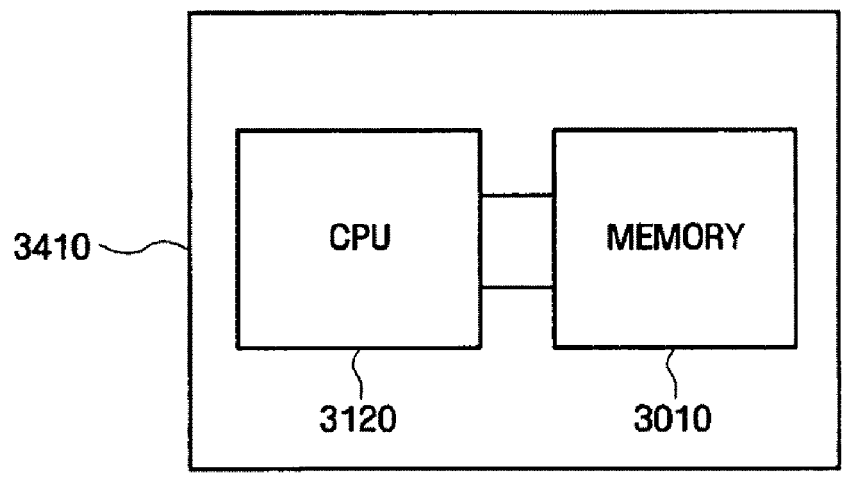

FIG. 34 illustrates a further embodiment of the present invention. As shown, the memory 3010 may be connected to a central processing unit (CPU) 3420 within a computer system 3410. For example, the computer system 3410 may be a personal computer, personal data assistant, etc. The memory 3010 may be directly connected with the CPU 3420, connected via a bus, etc. It will be appreciated, that FIG. 34 does not illustrate the full complement of components that may be included within a computer system 3410 for the sake of clarity.

Figure 35:
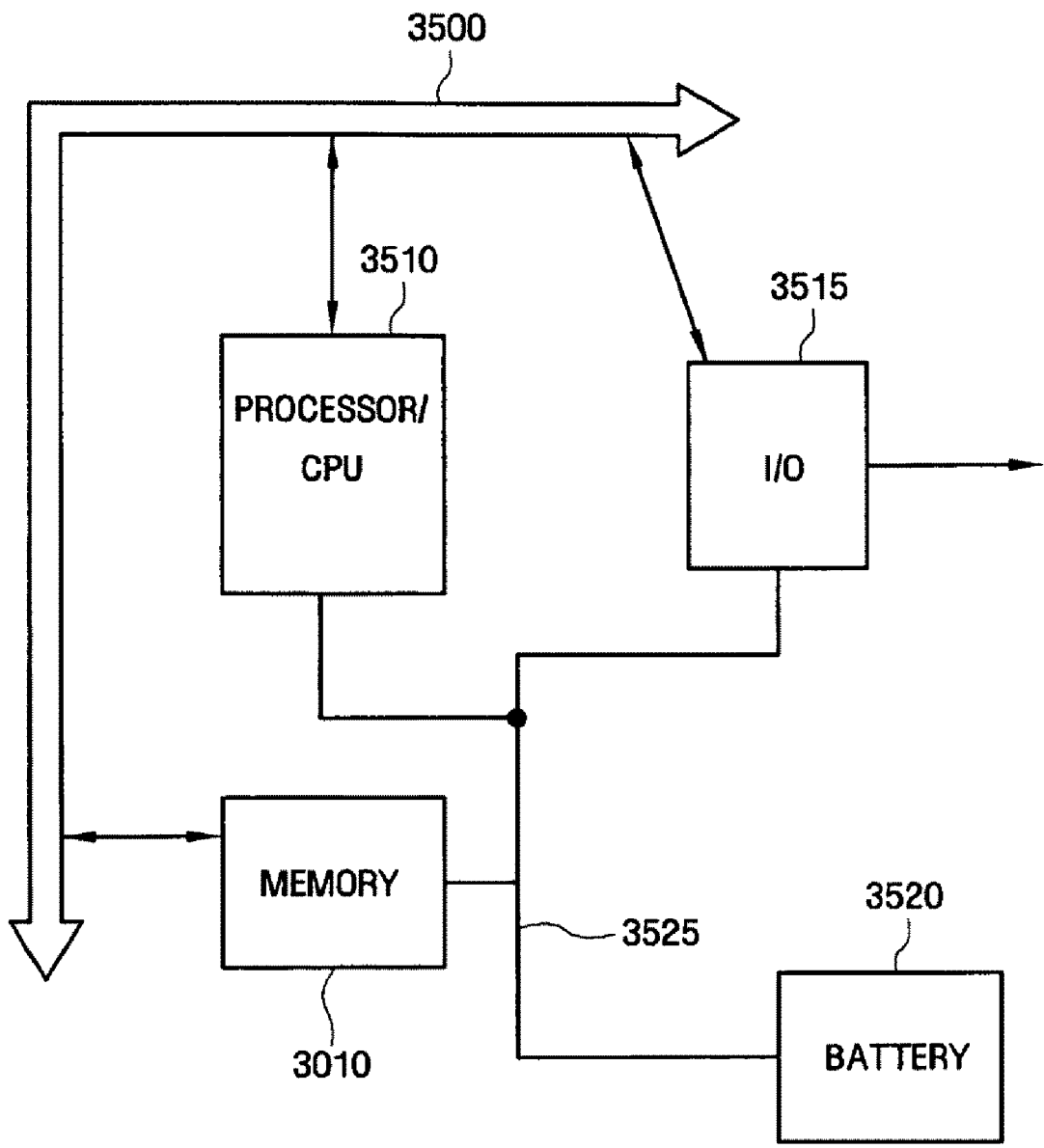

FIG. 35 illustrates another embodiment of the present invention. FIG. 35 may represent another portable application of the semiconductor device embodiments described above. As shown, this embodiment includes the memory 3010, which may be any of the semiconductor device embodiments described above. In this and any of the previous embodiments, the memory 3010 may include one or more integrated circuit dies where each die has a memory array that operates according to the various embodiments. These IC dies may be separate, stand alone memory devices that are arranged in modules such as conventional dynamic random access memory (DRAM) modules, or they may be integrated with other on-chip functionalities. In the latter embodiments, the memory 3010 may be part of an I/O processor or a microcontroller as described above.

This and the other portable application embodiments may be for instance a portable notebook computer, a digital still and/or video camera, a personal digital assistant, a mobile (cellular) hand-held telephone unit, navigation device, GPS system, audio and/or video player, etc. Of course, there are other non-portable applications for the memory 3010. These include, for instance, large network servers or other computing devices which may benefit from a non-volatile memory device.

As shown in FIG. 35, this embodiment includes a processor or CPU 3510 that uses the memory 3010 as program memory to store code and data for its execution. Alternatively, the memory 3010 may be used as a mass storage device for non-volatile storage of code and data. The portable application embodiment may communicate with other devices, such as a personal computer or a network of computers via an I/O interface 3515. This I/O interface 3515 may provide access to a computer peripheral bus, a high speed digital communication transmission line, or an antenna for unguided transmissions. Communications between the processor and the memory 3010 and between the processor 3510 and the I/O interface 3515 may be accomplished using conventional computer bus architectures as represented by bus 3500 in FIG. 35. Furthermore, the present invention is not limited to this architecture. For example, the memory 3010 may be replaced with the embodiment of FIG. 31, and communication with the processor 3510 may be via the memory controller 3020. Furthermore, the I/O interface 3515 may communicate with the memory 3010 via the memory controller 3020, or directly with the memory 3010 if the memory controller is not present. In portable applications, the above-described components are powered by a battery 3520 via a power supply bus 3525.

The invention being thus described, it will be obvious that the same may be varied in many ways. Such variations are not to be regarded as a departure from the invention, and all such modifications are intended to be included within the scope of the invention.

We claim:

1. A semiconductor device, comprising:
 a non-volatile memory cell array, memory cells of the non-volatile memory cell array being resistance based, and each memory cell having a resistance that changes over time after data is written into the memory cell;
 a write address buffer configured to store write addresses associated with data being written into the non-volatile memory cell array; and
 a read unit configured to perform a read operation to read data from the non-volatile memory cell array, the read unit configured to control a read current applied to the non-volatile memory cell array during the read operation based on whether a read address matches one of the stored write addresses and at least one indication of settling time of the data being written into the non-volatile memory cell array.

2. The semiconductor device of claim 1, wherein the write address buffer is configured to compare the read address to valid write addresses stored in the write address buffer.

3. The semiconductor device of claim 2, wherein the write address buffer is configured to maintain a flag associated with each write address stored in the write address buffer, and the flag indicates whether the associated write address is valid.

4. The semiconductor device of claim 3, further comprising:
 a validity timer configured to measure a validity time period, the validity timer being reset in response to a received write command; and wherein
 the write address buffer is configured to set the validity flags to an invalid state in response to expiration of the validity time period.

5. The semiconductor device of claim 1, wherein the read unit is configured to apply a lower read current if no match between the read address and one of the stored write addresses exits than if a match between the read address and one of the stored write addresses exits and the indication indicates that the settling time has not expired.

6. The semiconductor device of claim 1, wherein the read unit is configured to apply a lower read current if the indication indicates that the settling time has expired than if a match between the read address and one of the stored write addresses exits and the indication indicates that the settling time has not expired.

7. The semiconductor device of claim 1, wherein the read unit includes a timer measuring a time period equal to or greater than an amount of time for data written in the non-volatile memory cell array to settle.

8. The semiconductor device of claim 1, wherein the read unit comprises:
 a read circuit configured to apply the read current to the non-volatile memory cell array;
 a voltage generator configured to supply operational voltages; and
 a selector configured to select at least one of the operational voltages for use by the read circuit in applying the read current, the selector selecting the operational voltage based on whether a read address matches one of the stored write addresses and at least one indication of settling time of the data being written into the non-volatile memory cell array.

9. The semiconductor device of claim 8, wherein
 the read circuit is configured to apply one of a first current based on a first operational voltage and a second current based on a second operational voltage, the second current being less than the first current; and
 the selector is configured to select the first operational voltage if the read address matches one of the stored write addresses and the indication indicates that the settling time has not expired.

10. The semiconductor device of claim 9, wherein
 the selector is configured to select the second operational voltage if the read address does not match one of the stored write address.

11. The semiconductor device of claim 9, wherein
the selector is configured to select the second operational voltage if the indication indicates that the settling time has expired.

12. The semiconductor device of claim 8, wherein
the read circuit is configured to apply one of a first current based on a first operational voltage and a second current based on a second operational voltage, the second current being less than the first current; and
the selector is configured to select the second operational voltage if the read address does not match one of the stored write address; and
the selector is configured to select the second operational voltage if the indication indicates that the settling time has expired.

13. The semiconductor device of claim 12, wherein
the selector is configured to select the first operational voltage if the read address matches one of the stored write addresses and the indication indicates that the settling time has not expired.

14. The semiconductor device of claim 13, wherein
the first operational voltage changes with respect to temperature; and
the second operational voltage does not change with respect to temperature.

15. The semiconductor device of claim 13, wherein the read circuit comprises:
a read bias unit configured to generate the first current based on the first operational voltage, configured to generate the second current based on the second operational voltage, and configured to output one of the first and second currents to the non-volatile memory cell array based on at least one control bias;
a current clamping circuit configured to restrict flow of current from the read bias unit to the non-volatile memory cell array; and
a bias selection unit configured to generate the control bias based on output from the selector.

16. The semiconductor device of claim 15, wherein
the selector includes:
a timer configured to measure a time period indicative of the settling time of the data being written into the non-volatile memory cell array; and
a bias selector configured to generate a selection signal based output of the timer and a comparison result indicating whether the read address matches one of the stored write addresses; and wherein
the bias selection unit is configured to generate the control bias based on the selection signal.

17. The semiconductor device of claim 8, wherein the selector comprises:
a timer configured to measure a time period indicative of the settling time of the data being written into the non-volatile memory cell array; and
a bias selector configured to generate a selection signal based on output of the timer and whether the read address matches one of the stored write addresses, the selection signal indicating the selection of the operational voltage.

18. The semiconductor device of claim 13, wherein the read circuit comprises:
a read bias unit configured to generate a current;
a current clamping circuit configured to restrict flow of the current from the read bias unit to the non-volatile memory cell array based on a control bias; and
a bias selection unit configured to supply one of the first and second operational voltages as the control bias based on output from the selector.

19. The semiconductor device of claim 8, wherein the read circuit comprises:
a read bias unit configured to generate a current based on a first control bias;
a current clamping circuit configured to restrict flow of the current from the read bias unit to the non-volatile memory cell array based on a second control bias;
a first bias selection unit configured to generate the first control bias based on output from the selector; and
a second bias selection unit configured to generate the second control bias based on output from the selector.

20. The semiconductor device of claim 1, wherein the read unit is configured to apply a read current based on a period of time since data was written in the non-volatile memory cell array if a match between the read address and one of the stored write addresses exits and the indication indicates that the settling time has not expired.

21. The semiconductor device of claim 20, wherein the read unit is configured to apply a lower read current as the period of time since data was written in the non-volatile memory cell array increases.

22. The semiconductor device of claim 20, wherein the settling time is divided into a plurality of intervals, and the read unit is configured to apply a different read current during each interval if a match between the read address and one of the stored write addresses exits and the indication indicates that the settling time has not expired.

23. The semiconductor device of claim 22, wherein the read unit comprises:
a read circuit configured to apply the read current to the non-volatile memory cell array;
a voltage generator configured to supply a plurality operational voltages; and
a selector configured to measure the plurality of intervals, and select at least one of the operational voltages for use by the read circuit in applying the read current based on the measurements and whether the read address matches one of the stored write addresses.

24. The semiconductor device of claim 23, wherein the operational voltage selected if the read address matches one of the stored write addresses and the settling time has not expired varies with temperature.

25. The semiconductor device of claim 22, wherein the read circuit comprises:
a read bias unit configured to generate a plurality of currents based on the plurality of operational voltages, and output one of the plurality of currents based on control biases;
a current clamping circuit configured to restrict flow of current from the read bias unit to the non-volatile memory cell array; and
a bias selection unit configured to generate the control biases based on output from the selector.

26. The semiconductor device of claim 24, wherein selector comprises:
a timer configured to measure each interval, and output a timing signal associated with each interval, each timing signal indicating whether an amount of time since writing data is in the associated time interval; and
a logic circuit configured to generate a plurality of selection signals based on the timing signals and whether the read address matches one of the stored write addresses.

27. The semiconductor device of claim 22, wherein the read circuit comprises:

a read bias unit configured to generate a current;

a current clamping circuit configured to restrict flow of the current from the read bias unit to the non-volatile memory cell array based on a control bias; and a bias selection unit configured to supply one of the plurality of operational voltages as the control bias based on output from the selector.

28. The semiconductor device of claim 22, wherein the read circuit comprises:

a read bias unit configured to generate a current based on a first control bias;

a current clamping circuit configured to restrict flow of the current from the read bias unit to the non-volatile memory cell array based on a second control bias;

a first bias selection unit configured to generate the first control bias based on output from the selector and at least one of the operational voltages; and a second bias selection unit configured to generate the second control bias based on output from the selector and at least one of the operational voltages.

29. The semiconductor device of claim 1, wherein the write address buffer is divided into a plurality of units, each unit including at least one storage location, and each unit configured to generating a composite signal indicating whether the read address matches one of the write addresses stored in the unit.

30. The semiconductor device of claim 29, wherein the read unit comprises:

a read circuit configured to apply the read current to the non-volatile memory cell array;

a voltage generator configured to supply a plurality operational voltages; and a selector configured to select at least one of the operational voltages for use by the read circuit in applying the read current based on the composite signal output from each unit and at least one indication of settling time of the data being written into the non-volatile memory cell array.

31. The semiconductor device of claim 30, wherein the selector selects the operational voltage such that the read current applied by the read circuit is higher if any of the composite signals indicates a match and the indication indicates the settling time has not expired than if one of (1) the indication indicates the settling time has expired and (2) none of the composite signals indicates a match.

32. The semiconductor device of claim 30, wherein the settling time is divided into a plurality of intervals;

the selector includes:

a plurality of timers, each of the plurality of timers associated with a different one of the plurality of units, each timer configured to measure each interval and output a timing signal associated with each interval, each timing signal indicating whether an amount of time since writing data is in the associated time interval;

a plurality of logic circuits, each logic unit associated with a different one of the plurality of units and the associated timer, each logic circuit configured to generate a plurality of selection signals based on the timing signals from the associated timer and whether the read address matches one of the stored write addresses in the associated unit; and a composite logic circuit generating a plurality of composite selection signals based on the selection signals output from the plurality of logic circuits.

33. The semiconductor device of claim 32, wherein the selection signals output from each logic circuit indicate the operational voltage to select; and the composite logic circuit generates the composite selection signals to select one of the operational voltages indicated by the plurality of logic circuits that results in the highest read current.

34. The semiconductor device of claim 33, wherein the read circuit comprises:

a read bias unit configured to generate a plurality of currents based on the plurality of operational voltages, and output one of the plurality of currents based on control biases;

a current clamping circuit configured to restrict flow of current from the read bias unit to the non-volatile memory cell array; and a bias selection unit configured to generate the control biases based on output from the selector.

35. The semiconductor device of claim 33, wherein the read circuit comprises:

a read bias unit configured to generate a current;

a current clamping circuit configured to restrict flow of the current from the read bias unit to the non-volatile memory cell array based on a control bias; and a bias selection unit configured to supply one of the plurality of operational voltages as the control bias based on output from the selector.

36. The semiconductor device of claim 33, wherein the read circuit comprises:

a read bias unit configured to generate a current based on a first control bias;

a current clamping circuit configured to restrict flow of the current from the read bias unit to the non-volatile memory cell array based on a second control bias;

a first bias selection unit configured to generate the first control bias based on output from the selector and at least one of the operational voltages; and a second bias selection unit configured to generate the second control bias based on output from the selector and at least one of the operational voltages.

37. A semiconductor device, comprising:

a non-volatile memory cell array, memory cells of the non-volatile memory cell array being resistance based, and each memory cell having a resistance that changes over time after data is written into the memory cell;

a write address buffer configured to store write addresses associated with data being written into the non-volatile memory cell array; and a read unit configured to perform a read operation to read data from the non-volatile memory cell array, the read unit configured to control a read current applied to the non-volatile memory cell array during the read operation based on whether a read address matches one of the stored write addresses and at least one indication of an amount of time since data was written into the non-volatile memory cell array.

38. A card, comprising:

a memory, the memory including:

a non-volatile memory cell array, memory cells of the non-volatile memory cell array being resistance based, and each memory cell having a resistance that changes over time after data is written into the memory cell;

a write address buffer configured to store write addresses associated with data being written into the non-volatile memory cell array;

a read unit configured to perform a read operation to read data from the non-volatile memory cell array, the read unit configured to control a read current applied to the non-volatile memory cell array during the read operation based on whether a read address matches one of the stored write addresses and at least one indication of settling time of the data being written into the non-volatile memory cell array; and a control unit configured to control the memory.

39. A system, comprising:

a bus;

a semiconductor device connected to the bus, the semiconductor device including:
- a non-volatile memory cell array, memory cells of the non-volatile memory cell array being resistance based, and each memory cell having a resistance that changes over time after data is written into the memory cell;
- a write address buffer configured to store write addresses associated with data being written into the non-volatile memory cell array;
- a read unit configured to perform a read operation to read data from the non-volatile memory cell array, the read unit configured to control a read current applied to the non-volatile memory cell array during the read operation based on whether a read address matches one of the stored write addresses and at least one indication of settling time of the data being written into the non-volatile memory cell array; and an input/output device connected to the bus; and a processor connected to the bus, the processor configured to communicate with the input/output device and the semiconductor device via the bus.

40. A method of reading data from a semiconductor device, comprising:
- storing data being written into the non-volatile memory cell array in a write buffer;
- storing write addresses associated with data being written into the non-volatile memory cell array; and
- controlling a read current applied to the non-volatile memory cell array during a read operation based on whether a read address matches one of the stored write addresses and at least one indication of settling time of the data being written into the non-volatile memory cell array.

* * * * *